United States Patent
Moslehi

[19]

[11] Patent Number: 6,016,000
[45] Date of Patent: Jan. 18, 2000

[54] ULTRA HIGH-SPEED CHIP SEMICONDUCTOR INTEGRATED CIRCUIT INTERCONNECT STRUCTURE AND FABRICATION METHOD USING FREE-SPACE DIELECTRICS

[75] Inventor: Mehrdad M. Moslehi, Los Altos, Calif.

[73] Assignee: CVC, Inc., Rochester, N.Y.

[21] Appl. No.: 09/064,431

[22] Filed: Apr. 22, 1998

[51] Int. Cl.[7] .................................................. H01L 29/00
[52] U.S. Cl. ........................................... 257/522; 257/758
[58] Field of Search .................................... 257/522, 758, 257/759, 751

[56] References Cited

U.S. PATENT DOCUMENTS

| | | | |
|---|---|---|---|
| 3,890,636 | 6/1975 | Harada et al. . | |
| 4,289,846 | 9/1981 | Parks et al. | 430/314 |
| 4,933,743 | 6/1990 | Thomas et al. . | |
| 5,117,276 | 5/1992 | Thomas et al. | 257/522 |
| 5,256,869 | 10/1993 | Lin et al. | 250/201.9 |
| 5,372,969 | 12/1994 | Moslehi | 437/195 |
| 5,641,712 | 6/1997 | Grivna et al. | 438/624 |
| 5,798,559 | 8/1998 | Bothra et al. | 257/522 |

FOREIGN PATENT DOCUMENTS

| | | | |
|---|---|---|---|
| 0 475 646 A2 | 8/1991 | European Pat. Off. | H01L 23/522 |
| 0 644 443 A1 | 9/1994 | European Pat. Off. | G02B 6/42 |

OTHER PUBLICATIONS

Solid State, by Linda Gepperts, IEEE Spectrum, Jan. 1998, pp. 23–28.

*Primary Examiner*—Sheila V. Clark
*Attorney, Agent, or Firm*—Gray Cary Ware & Freidenrich, LLP

[57] ABSTRACT

Ultra high-speed multi-level interconnect structure and fabrication process flows are disclosed for a semiconductor integrated circuit chip. The interconnect structures of this invention include a plurality of electrically conductive metallization levels. Each of the metallization levels includes a plurality of electrically conductive interconnect lines. A plurality of electrically conductive plugs make electrical connections between various metallization levels as well as between the metallization levels and the semiconductor devices fabricated on the semiconductor substrate. The invention further includes a free-space medium occupying at least a substantial fraction of the electrically insulating regions within the multi-level interconnect structure surrounding the interconnect lines and plugs. A top passivation overlayer hermetically seals the multi-level interconnect structure. The top passivation overlayer used for hermetic sealing also functions as a heat transfer medium to facilitate heat removal from the interconnect metallization structure as well as to provide additional mechanical support for the multi-level interconnect structure through contact with the top metallization level of the multi-level interconnect structure. The hermetically sealed free-space medium minimizes the capacitive cross-talk noise in the interconnect structure, enabling increased chip operating speeds and reduced chip power distribution.

35 Claims, 17 Drawing Sheets

$$P_m = 1.8 \frac{\mu n}{C}$$

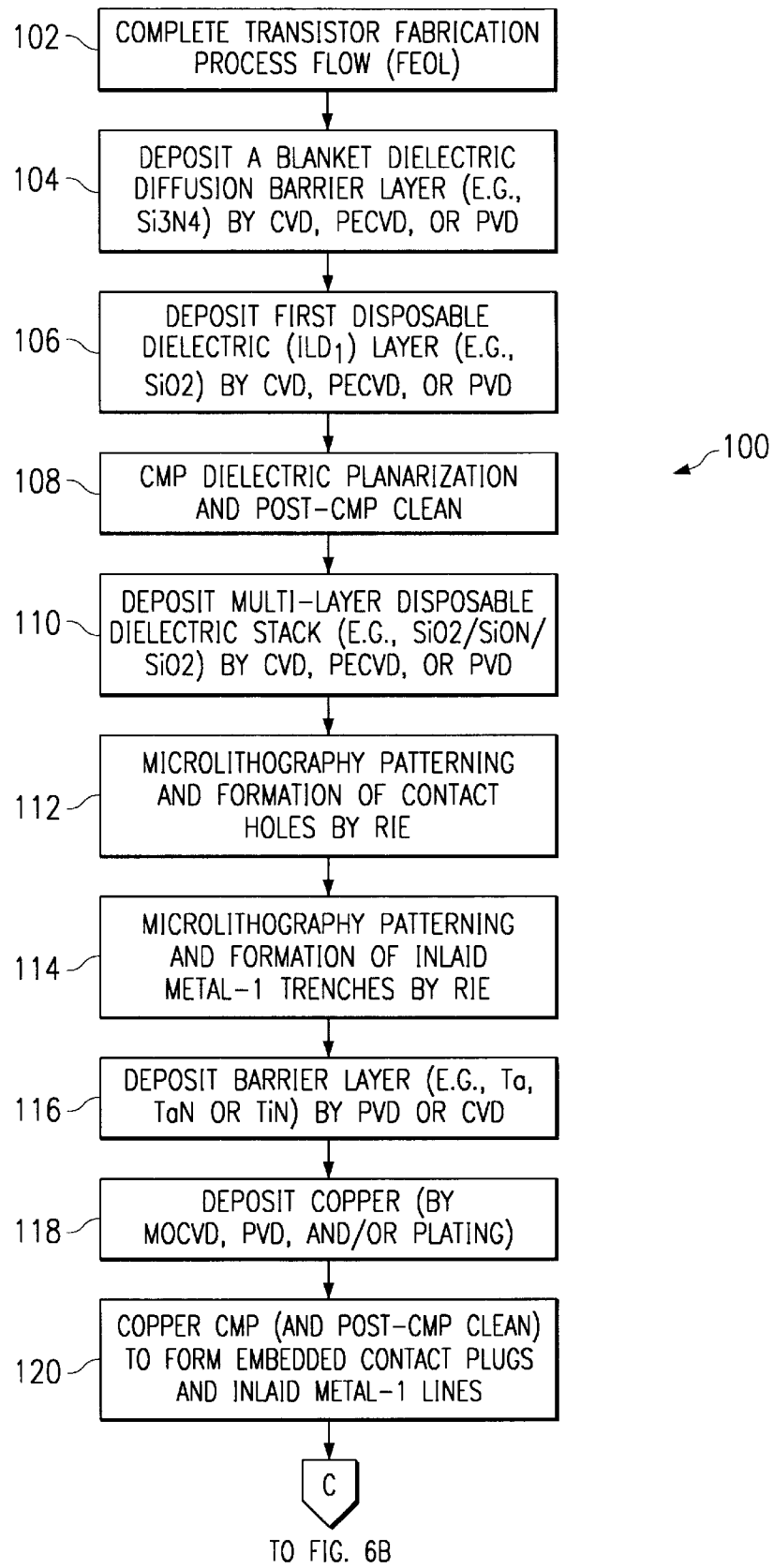

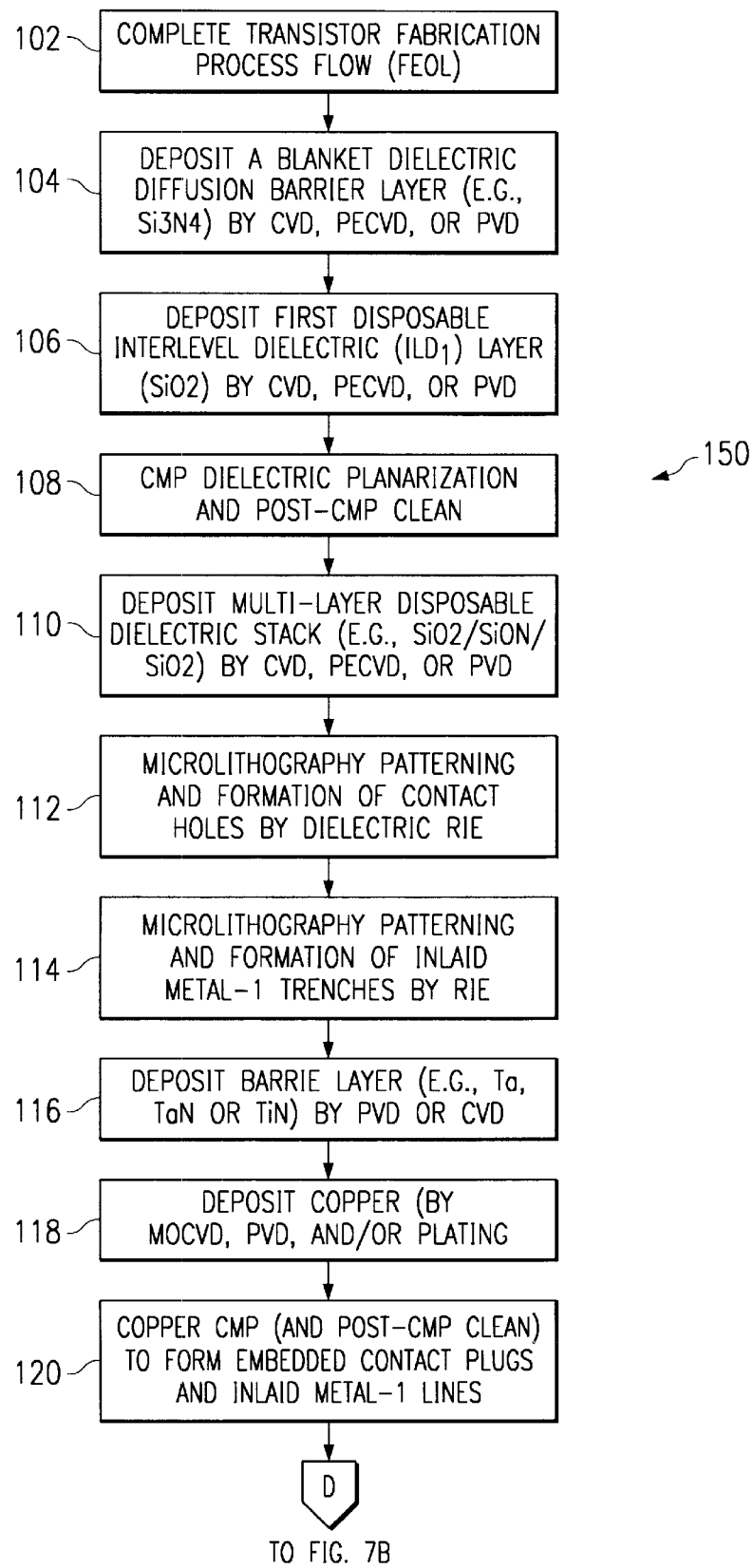

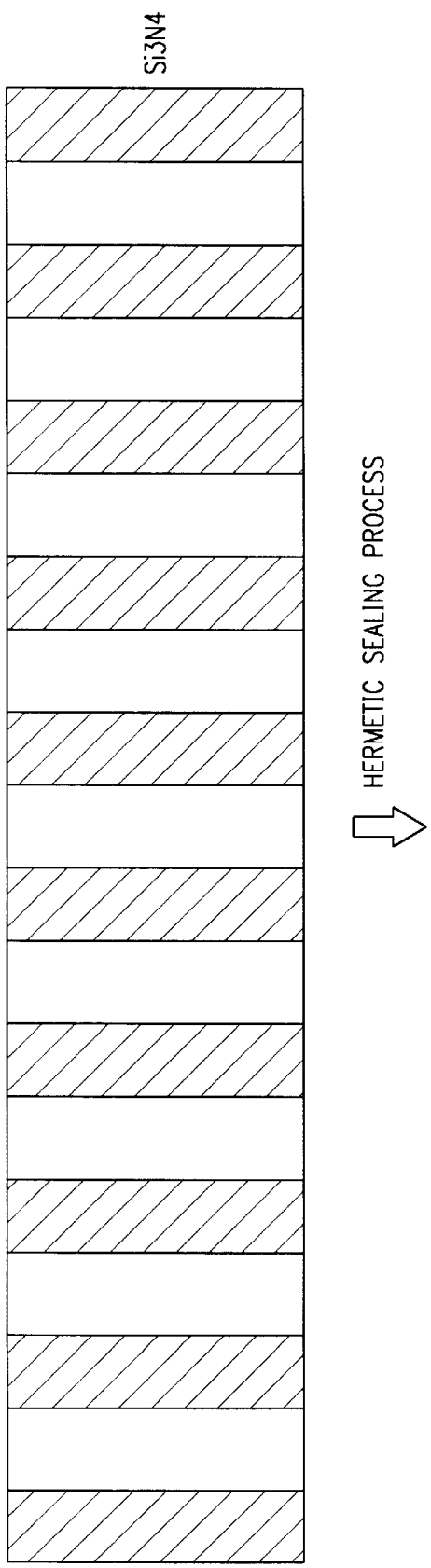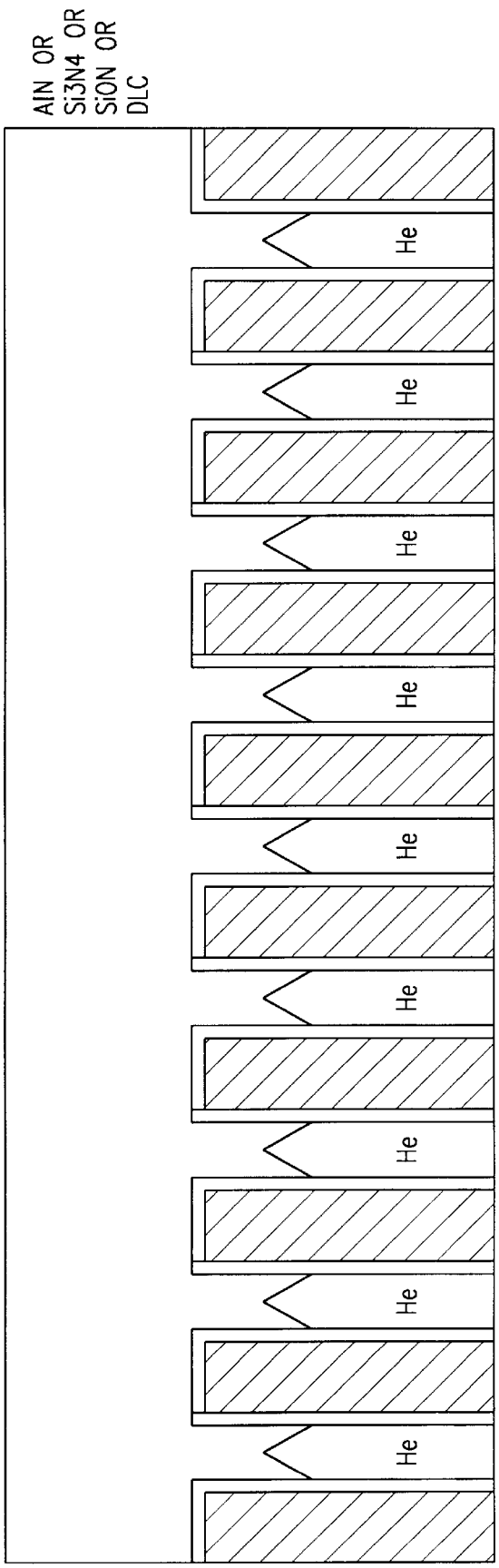
FIG. 14

ULTRA HIGH-SPEED CHIP SEMICONDUCTOR INTEGRATED CIRCUIT INTERCONNECT STRUCTURE AND FABRICATION METHOD USING FREE-SPACE DIELECTRICS

FIELD OF THE INVENTION

The present invention relates to semiconductor integrated circuits and, more particularly, to structures and methods of fabricating integrated circuit interconnect devices. Even more particularly, the present invention relates to an ultra high-speed chip interconnect structure and methods of forming such a structure that integrates free-space intermetal and interlevel dielectric regions with at least one high-conductivity interconnect conductor for the purpose of establishing optimally low permittivity between adjacent intralevel and interlevel conductor lines and plugs. This invention offers improved interconnect structures and methods which will reduce the parasitic effects of the interconnect structure and enable significant enhancements of the semiconductor integrated circuit speed and operational reliability. The structures and methods of this invention also allow simplification at the interconnect process flow, resulting in reduced chip manufacturing cost.

BACKGROUND OF THE INVENTION

The speed and reliability performance parameters of state-of-the art semiconductor integrated circuit (IC) chips are mostly governed by the on-chip interconnects. Advanced semiconductor IC chips employ multi-level on-chip interconnects usually comprising aluminum (usually an alloy of aluminum comprising approximately 0.5% to 2% copper for improved electromigration reliability lifetime) metal lines, aluminum (again typically doped with copper) or tungsten plugs (for inter-level/inter-metal contact/via holes), and silicon dioxide (or fluorinated silicon dioxide $SiO_xF_y$) or a combination of silicon dioxide with an organic low-permittivity (low-k) dielectric used as inter-metal and inter-level dielectrics. The speed performance of advanced semiconductor IC chips such as high-end microprocessors and digital signal processors (DSP) fabricated using 0.25 $\mu$m complementary metal-oxide-semiconductor (CMOS) technologies and beyond is limited by the interconnect signal propagation delays. The signal propagation delay for advanced interconnects is limited by the parasitic resistive, capacitive, and inductive elements. These include the interconnect metal "RC" delays, capacitive cross-talks or cross-talk noise between adjacent metal lines (due to voltage pulses), as well as inductive noise and cross-talks (due to voltage pulses).

As the device dimensions are scaled down, the metal interconnect line widths and pitches are also scaled down, accordingly. The maximum density (areal density) of metal interconnect lines on each interconnect level is limited by the minimum electrical conductivity requirements of the metal lines as well as the upper limits on the maximum allowable signal cross-talks. As the density of the metal interconnect lines on each interconnect level increases, the adjacent metal lines are placed closer to each other and the widths of the metal lines is also reduced. As the minimum feature size of the semiconductor (e.g., silicon CMOS) IC technologies is reduced to 0.25 $\mu$m and beyond, the "RC" propagation delays and the capacitive cross-talk noise have a significant impact on the speed performance of the IC chips, such as in high-end microprocessor and digital signal processor (DSP) chips. These problems place serious constraints on the minimum width (and thickness) of the metal lines and the minimum metallization layout pitches (or the minimum inter-line spacings), particularly on the interconnect levels which contain the long-range global interconnect lines (for instance, for signal or clock distribution) and/or power distribution.

The interconnect design rule constraints caused by the IC chip speed performance (and electromigration reliability lifetime) requirements result in an increase in the number of interconnect levels, particularly for complex logic chips such as high-end/high-speed microprocessors and digital signal processors. For instance, state-of-the-art CMOS logic technologies with minimum feature size of 0.20 to 0.25 $\mu$m may utilize as many as six or more levels of metal interconnects. Each additional level of metal interconnect adds significantly to the overall process flow complexity and chip manufacturing cost. This is due to both increased number of fabrication process steps in the process flow and the manufacturing yield reduction associated with a more complex and lengthy process flow.

Another limitation associating with existing interconnect structures arises because metal resistivity significantly contributes to the chip speed constraints and even the overall manufacture cost. The use of a higher conductivity metal such as copper instead of aluminum, since the bulk resistivity of copper is approximately 1.78 $\mu\Omega\cdot$cm versus approximately 2.7 $\mu\Omega\cdot$cm for aluminum, results in a significant reduction of the interconnect "RC" propagation delay for a given metal interconnect width and thickness. On the other hand, for a given interconnect line parasitic resistance, a higher metal conductivity (e.g., Cu instead of Al) allows the use of thinner metal lines on each interconnect level for a given metal line width. This, in turn, enables closer spacings between the adjacent metal lines or equivalently, a higher areal density of metal interconnect lines on each level for a given distribution of intra-level capacitive signal cross-talks.

The higher interconnect line densities on various interconnect levels enable a reduction in the number of required interconnect levels for a given chip speed performance. This results in reduced process complexity and cost. Alternatively, a higher conductivity conductor (e.g., copper instead of Al) can be used to not only reduce the process complexity and cost through reduction of the number of interconnect levels, but also to improve the chip speed performance. This can be done by both reducing the metal line resistance, increasing the interconnect metal line resistance, and increasing the interconnect metal line areal density.

For example, in an advanced 0.18 $\mu$m microprocessor logic chip, for a given maximum speed or clock frequency (e.g., an approximately 600-MHz microprocessor), comprising eight levels of Al metal interconnects, replacing Al with Cu accomplishes a number of desireable results. For instance, it is possible to reduce the process complexity and chip fabrication cost by, perhaps, approximately 30% while achieving the same speed performance of approximately 600 MHz. This can be achieved by reducing the number of interconnect levels from 8 to 6 and also due to the reduced number of process steps per level for copper interconnect compared to aluminum interconnect. It is also be possible to reduce the process complexity and chip fabrication cost by, perhaps, approximately 15–20%, while also improving the chip speed performance by, for instance, approximately 10% to approximately 660 MHz. For example, this may be achieved by reducing the number of metal interconnect levels from 8 to 7 and also reducing the resistance of the metal lines at the same time.

Besides the interconnect metal, the inter-metal/inter-level dielectric layers (IMD and ILD layers) also have a significant impact on the IC chip performance speed as well as manufacturing cost. The dielectric constant (i.e. relative dielectric constants with respect to free space) of the IMD/ILD material layers impacts not only the "RC" propagation delays but also the intra-level and inter-level capacitive cross-talks.

The mainstream ILD/IMD materials in silicon chip manufacturing are silicon dioxide ($SiO_2$) and/or derivatives of silicon dioxide (such as fluorinated silicon dioxide: $SiO_xF_y$) with k values in the range of 3.2 to over 4.0. There has been a significant amount of materials research on low-k dielectrics. The lowest practical k values to date have been reported for some spin-on organic dielectrics and porous aerogels/xerogels. The practical low-k dielectrics developed to date have k values in the range of 2.0 to 3.2. These low-k dielectrics, however, complicate the back-end interconnect process integration due to their inferior thermal stability as well as their electrical, mechanical and thermal conductivity properties compared to silicon dioxide.

FIG. 1 illustrates a side view of an interconnect structure 10 that includes a low-k organic ILD/IMD material layer 12 and trench 14. $SiO_2$ layer 16 covers ILD/ILD substrate 12. Covering trench 14 and top $SiO_2$ layer 16 is conformal $SiO_2$ buffer layer 18. The formation of organic low-k dielectric layer 12 also complicate the single or dual damascene processes commonly used for fabrication of copper interconnects due to the difficulties associated with their incompatibility with chemical-mechanical polishing (or CMP) processes used for copper and barrier removal during the interconnect fabrication process. As a result, most organic low-k dielectrics employ a suitable hard mask layer such as silicon dioxide for single or dual-damascene interconnect fabrication processes in order to facilitate formation of dielectric trenches and via holes for the embedded (inlaid) metal (e.g., copper) lines.

The optimal integration of most organic low-k dielectrics requires deposition of a thin conformal layer of, for instance, silicon dioxide, such as $SiO_2$ layer 18, followed by an anisotropic oxide etch process in order to cover the trench and via hold sidewalks with a thin layer of high-quality silicon dioxide dielectric, such as $SiO_2$ layer 18. This prevents a direct contact between the low-k dielectric and the deposited glue/barrier layer and may improve the overall breakdown voltage and leakage characteristics of the composite ILD/IMD layers. This requirement adds to the complexity and fabrication cost of the IMD/ILD integration. Moreover, the effective relative dielectric constant of the composite IMD/ILD layers is somewhat higher than that of the low-k dielectric by itself. This is due to the requirements for the hard mask and sidewalk oxide coverage.

One attempt to provide a lowest possible relative permittivity or k value has been to use free space dielectric between interconnects. Free space provides the best possible dielectric since it provides k=1. This is a factor of approximately 4 times better than silicon dioxide and even a factor of 2 to 3 better than the best practical low-k dielectric materials. As a result, for a given metal conductivity and sheet resistance distribution, the free-space dielectric results in a significant reduction of the interconnect "RC" propagation delays and capacitive cross-talk noise.

The main challenges with the free-space dielectric IMD/ILD integration are the ability to remove heat from the multi-level interconnect structure and the ability to form a hermetically sealed chip packages protecting the multi-level interconnect structure and the active devices on the substrate.

The prior art multi-level interconnect structures (using either silicon dioxide or any solid ILD/IMD low-k material layer) typically require an effective glue/barrier layers. This is particularly critical for a high electrical conductivity material such as copper (or silver) since copper (or silver or gold) act as electrical trap centers in silicon and can severely degrade the transistor properties such as transconductance, junction leakage, standby power dissipation and reliability lifetime. Moreover, copper, as well as some other metallic elements such as gold and silver can cause severe degradation of the ILD/IMD layers adversely affecting their electrical leakage and breakdown properties. As a result, the prior art silicon chip interconnect structures and fabrication process flows employ conductive diffusion barrier layers (such as TiN, Ta, TaN, TiSiN, TaSiN, WN, WSiN, MoN, or MoSiN). The long-term chip reliability lifetime and chip manufacturing yield requirements place limits on the minimum thickness of the barrier material for such devices.

As the chip IC device dimension are scaled down, the width of the metal lines and also the dimensions or diameters of the via plugs are also reduced, whereas the thickness of the diffusion barrier layer is scaled down more slowly. Thus, with each successive technology generation, the barrier material thickness (and cross sectional area) becomes a larger fraction of the conductive interconnect lines. One example of this phenomenon can be examined in the case of dual-damascene copper interconnects. In IC chips with copper metallization, a larger fraction of the diameter of the conductive via plug is also consumed by the barrier material. For instance, for a damascene trench width of 0.20 $\mu$m and a conformal diffusion barrier thickness of 250 Å (deposited, for example, by a conformal chemical-vapor deposition or CVD process), the high-conductivity metal (e.g., copper with a resistivity of approximately 1.8 $\mu\Omega\cdot$cm) only occupies a metal line width or a via plug diameter of only 0.15 $\mu$m, due to the peripheral space occupied by the diffusion barrier layer. Since the typical diffusion barrier layers have much higher electrical resistivity values compared to the high-conductivity interconnect metals (e.g., in the range of approximately 150–250 $\mu\Omega\cdot$cm for Ta and TaN diffusion barriers vs. approximately 1.8 $\mu\Omega\cdot$cm for copper), the diffusion barrier layer degrades the overall interconnect metal line resistance, as well as via plug resistance values. For instance, FIG. 2 shows damascene dielectric trench structures 20 and 22 (e.g., for fabrication of embedded copper metal line) with a width W and height H.

In damascene dielectric trench structure 22 (FIG. 2b), trench 24 is filled entirely with the high conductivity metal line having electrical resistivity of $\rho_m$. On the other hand, damascene trench structure 20 (FIG. 2a) includes barrier layer 26 (shown as a conformal layer) with a layer thickness $t_b$ and a material resistivity of $\rho_b$ in trench 28. The high conductivity metal line 28 occupies the remaining space surrounded by the barrier layer. Assuming $\rho_b >> \rho_m$, which is typically the case in practice, we can compare the total conductor line resistance per unit length for these two conditions:

$R_1 \triangleq$ conductor line resistance per unit length without the barrier layer (FIG. 2b);

$R_2 \triangleq$ conductor line resistance per unit length with the barrier layer (FIG. 2a)

$$R_1 = \frac{\rho_m}{W \cdot H}, \quad R_2 = \underbrace{\left[\frac{\rho_m}{(W-2t_b)(H-t_b)}\right] \bigg\| \left[\frac{\rho_b}{t_b(2H+W)}\right]}_{\text{Two resistive components in parallel}}$$

Since $\rho_b \gg \rho_m$, the conclusion follows that $R_{2b} \gg R_{2m}$ and, as a result, $$R_2 \cong R_{2m} = \frac{\rho_m}{(W-2t_b)(H-t_b)}$$

$$R_2 \cong \frac{\rho_m}{WH + 2t_b^2 - t_b W - 2t_b H}$$

$$R_2 \cong \frac{\rho_m}{WH - t_b(W+2H) + 2t_b^2}$$

$$\therefore \frac{1}{R_2} \cong \frac{WH + 2t_b^2 - t_b(W+2H)}{\rho_m}$$

$$\frac{1}{R_2} = \frac{WH}{\rho_m} + \frac{2t_b^2 - t_b(W+2H)}{\rho_m}$$

$$\frac{1}{R_2} \cong \frac{1}{R_1} - \left[\frac{t_b(W+2H-2t_b)}{\rho_m}\right]$$

For instance, assume W=0.25 μm, H=0.50 μm, $t_b$=250 Å (0.025 μm), and Pm=2 μΩ•cm:

$$R_1 = \frac{\rho_m}{W \cdot H} = \frac{2 \times 10^{-6} \ \Omega \cdot \text{cm}}{(0.25 \times 10^{-4} \text{ cm})(0.50 \times 10^{-4} \text{ cm})}$$

$R_1 = 1600 \ \Omega/\text{cm}$ (without barrier)

$$R_2 \cong \frac{2 \times 10^{-6} \ \Omega \cdot \text{cm}}{(0.25 - 0.05)(0.50 - 0.025) \times 10^{-8}} = \frac{200}{0.20 \times 0.475} \ \Omega/\text{cm}$$

$R_2 = \frac{1000}{0.475} \ \Omega/\text{cm} \cong 2105 \ \Omega/\text{cm}$ with barrier $R_1 = 1600 \ \text{m} \ \Omega/\text{cm}, R_2 \cong \Omega/\text{cm}$ As a result, in this example, the presence of the barrier layer has degraded the effective interconnect line resistance by over 30% which is a significant amount of interconnect conductor conductivity loss.

Similarly, the barrier layer can also degrade the effective via plug resistance. For instance, FIG. 3 shows via plugs 30 and 32 connecting the metal lines between two adjacent interconnect levels. Via plug 30 (FIG. 3a) includes metal plug between metal lines 34 and 35 which is fully surrounded at the bottom and sidewalls by the barrier layer 36. Via plug 32 of FIG. 3b, on the other hand, shows an ideal situation without a barrier layer surrounding metal plug 32 (connecting metal lines 38 and 40).

Assume the via hole (cylindrical via hole) has a diameter of D and a height of H. We can also define the following parameters:

$R_{P2}$ ≙ effective via plug resistance with the barrier layer (FIG. 3a); and $R_{P1}$ ≙ effective via plug resistance without the barrier layer (FIG. 3b).

Also, assume that the via plug metal has a resistivity of $\rho_m$ (1.8 μ•cm), which is preferably the same as that of the interconnect metal lines on levels N and N−1. Moreover, assume that the barrier layer is conformal, has a thickness of $t_b$, and a resistivity of $\rho_b$. Moreover, assume that $\rho_b \gg \rho_m$.

Let's calculate $R_{P1}$ and $R_{P2}$ for the two via plug structures of FIGS. 3a and 3b:

$$R_{P1} = \frac{\rho_m H}{\left(\frac{\Pi D^2}{4}\right)} = \frac{4\rho_m H}{\Pi D^2}$$

$$R_{P2} \cong \underbrace{\left\{\frac{\rho_m (H-t_b)}{\Pi(D-2t_b)^2} \bigg\| \frac{\rho_b(H-t_b)}{\left\{\frac{\Pi}{4}[D^2-(D-2t_b)^2]\right\}}\right\}}_{\text{two resistive components in parallel}} + 2Rc + \frac{\rho_b t_b}{\left(\frac{\Pi D^2}{4}\right)}$$

Since ρb>>ρm $$R_{P2} \cong \frac{4\rho_m(H-t_b)}{\Pi(D-2t_b)^2} + \frac{4\rho_b t_b}{\Pi D^2} + 2Rc$$

Where Rc is the effective contact resistance at each interface between the barrier layer and either the via metal plug or the underlying metal line. As an example, assume D=0.25 μm, H=0.75 μm, $t_b$=250 Å (0.025 μm), and $P_m$=2 μΩ•cm ($\rho_b \gg \rho_m$). Assume that $\rho_b$=200 μΩ•m. $R_{P1}$ and $R_{P2}$ can be calculated as follows:

$$R_{P1} = \frac{4 \times 10^{-6} \ \Omega \cdot \text{cm} \times 0.75 \times 10^{-4} \text{ cm}}{\Pi(0.25 \times 10^{-4} \text{ cm})^2}$$

$$= \frac{6 \times 10^{-10} \ \Omega \text{cm}^2}{\Pi \times 0.25^2 \times 10^{-8} \text{ cm}^2} = \frac{96 \times 10^{-2}}{\Pi} \ \Omega \cong 0.305 \ \Omega$$

Thus, $R_{P1}$=0.305 Ω which is the plug resistance for the ideal case without the barrier layer.

$$R_{P2} \cong \frac{4 \times 2 \times 10^{-6}(0.75-0.025) \times 10^{-4} \ \Omega \cdot \text{cm}^2}{\Pi[(0.25-2\times 0.025)\times 10^{-4}]^2 \text{ cm}^2} +$$

$$\frac{4 \times 200 \times 10^{-6} \times 0.025 \times 10^{-4} \ \Omega \cdot \text{cm}^2}{\Pi(0.25 \times 10^{-4})^2 \text{ cm}^2} + 2Rc =$$

$$\frac{8 \times 0.725 \times 10^{-10}}{\Pi \times 0.20^2 \times 10^{-8}} + \frac{2 \times 10^{-9}}{\Pi \times 0.25^2 \times 10^{-8}} + 2Rc \ \Omega$$

$$R_{P2} = \frac{5.8 \times 10^{-2}}{\Pi \times 0.040} + \frac{2 \times 10^{-1}}{\Pi \times 0.25^2} + 2Rc \ \Omega = 0.462 + 1.019 + 2Rc \ \Omega$$

Thus, $R_{P2}$=1.480+2Rc Ω, which is the plug resistance for the via plug structure comprising the barrier layer.

It can be seen that even without including the contact resistance contribution 2Rc (due to the two barrier/metal it contact interfaces in each plug), the barrier layer results in a significant degradation of the overall via plug resistance. This effect, in turn results in the degradation of the chip speed due to the increased "RC" propagation delays in the interconnect structure.

In light of the above information, therefore, there is need for a semiconductor IC chip interconnect structure and a related fabrication process flow which can significantly reduce the parasitic resistive and capacitive elements, as well as the related "RC" propagation delays and interconnect capacitive cross-talks. Satisfying this need will enable much faster chip operations and/or lower chip power consumption.

Moreover, there is a need for an improved chip interconnect structure and related process flow which can enable a reduction of the total number of on-chip interconnect levels required for fabrication of high performance semiconductor IC chips. Satisfying this need results in a reduction in the chip fabrication process flow complexity, improving the manufacturing yield, and reducing the overall production costs.

There is the need for an interconnect structure and a related interconnect fabrication process flow which enable the use of a lowest possible dielectric permittivity for IMD/ILD applications.

There is a further need for an interconnect structure and related fabrication process flow that can eliminate the additional process complexities and fabrication cost associated with the integration of low-k dielectric materials by using free-space as the IMD/ILD layers. There is also a need for an advanced multi-level interconnect structure and a related fabrication process flow which enable efficient heat removal from the interconnect structure, and also allow formation of a fully hermetically sealed chip package.

SUMMARY OF THE INVENTION

In accordance with the present invention, an ultra-high-speed semiconductor IC chip interconnect comprising free-space dielectric medium is disclosed that substantially eliminates or reduces disadvantages and problems associated with previously developed and prior art multi-level interconnect structures and methods of fabrication.

According to one embodiment of the present invention, an ultra-high-speed multi-level chip interconnect structure is provided for a semiconductor IC chip that includes a plurality of electrically conductive metallization levels. Each of the metallization levels includes a plurality of electrically conductive interconnect lines or segments. A plurality of electrically conductive via and contact plugs make electrical connections between various metallization levels as well as between the metallization levels and the semiconductor devices. The invention further includes a free-space medium occupying at least a substantial fraction of the electrically insulating regions separating the conducting lines and plugs within the multi-level interconnect structure. A top passivation overlayer hermetically seals the multi-level interconnect structure and the underlying devices on the semiconductor substrate. The top passivation overlayer also functions as an effective heat transfer medium to facilitate heat removal from the interconnect structure as well as an additional mechanical support for the interconnect structure through a sealing contact with the top metallization level of the multi-level interconnect structure.

A technical advantage that the present invention provides is the practical use of a free-space interlevel/intermetal (ILD/IMD) dielectric medium. With the present invention, the interconnect structure provides reduced "RC" propagation delay and reduced capacitive cross-talk.

For an N-level (N≧1) interconnect structure, the present invention also provides the additional technical and economic advantages of reducing the number of diffusion barrier layers and corresponding deposition steps from N (in prior art methods) to one. This results in a significant interconnect process simplification and chip manufacturing cost reduction.

A further technical advantage of the present invention is its compatibility with and applicability to various types of interconnect metallization materials. This includes metals such as copper, gold, silver, aluminum, and various superconducting materials.

Compatibility with damascene (single damascene and dual-damascene) interconnect fabrication methods is also another technical advantage of the present invention. The present invention provides excellent thermal management and efficient heat dissipation removal capabilities.

Another technical advantage of the present invention is improved interconnect metal lead and plug conductances due to elimination of the need for all (but one) barrier layers (all via-level barrier layers can be eliminated).

The present invention provides the technical advantage of improved interconnect metallization electromigration lifetime due to homogeneous metallization structure with large-grain metal lines and contact/via plugs as well as direct, i.e., barrierless plug-to-metal line contacts between the via plugs and the adjacent metal lines on different interconnect levels.

The present invention further provides the technical advantage of eliminating the need to use low-k dielectric materials and the relatively complex and expensive process integration methods associated with them. The present invention reduces the number of fabrication process steps per interconnect level by about four steps, as compared to prior art methods for forming damascene interconnect structures with advanced low-k dielectrics.

This invention also provides the technical advantage of a much improved chip reliability by eliminating the physical paths for diffusion of the metal atoms, such as copper or gold or silver into the active semiconductor devices. Moreover, the free-space ILD/IMD structure eliminates the possibility of ILD/IMD electrical breakdown field degradation due to metal atom diffusion into the insulating regions. This eliminates the need for the use of diffusion barrier layers to encapsulate the metallization structure at each interconnect level.

The present invention provides the technical advantage of hermetic sealing of the multi-level interconnect structure and semiconductor IC devices either under vacuum or with the interconnect structure free-space medium filled and hermetically sealed with a controlled pressure of a suitable gas such as an inert gas (e.g., helium or argon).

Still a further technical advantage of the present invention is excellent mechanical strength and integrity of the multi-level interconnect structure and overall semiconductor chip resulting from the inventive process.

BRIEF DESCRIPTION OF THE DRAWINGS

A more complete understanding of the present invention and advantages thereof may be acquired by reference to the following description taken in conjunction with the accompanying drawings in which like reference numbers indicate like features and wherein:

FIG. 9 shows an array of square shaped holes. FIG. 10 shows an array of circular holes. FIGS. 11 and 12 show two different arrays of rectangular-shaped holes.)

FIG. 14 shows the top dielectric layer after formation of the etchant transmission windows used to enable formation of the free-space dielectric medium, and also following the subsequent deposition steps for hermetic sealing of the interconnect structure of the present invention.

BRIEF DESCRIPTION OF THE INVENTION

Figure 1:
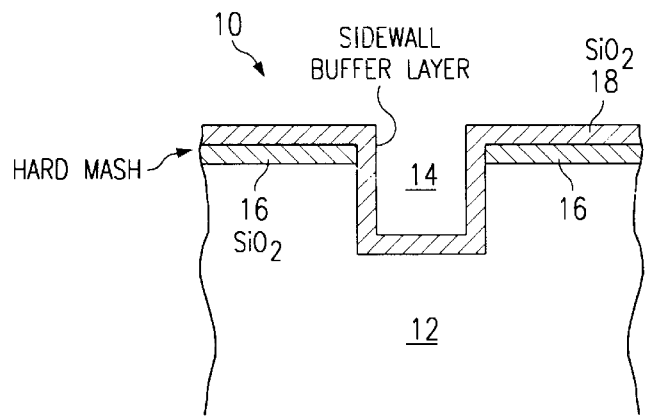
FIG. 1 illustrates the formation of a damascene trench in conjunction with an organic low-k dielectric layer according to a prior art method.
Figure 2:
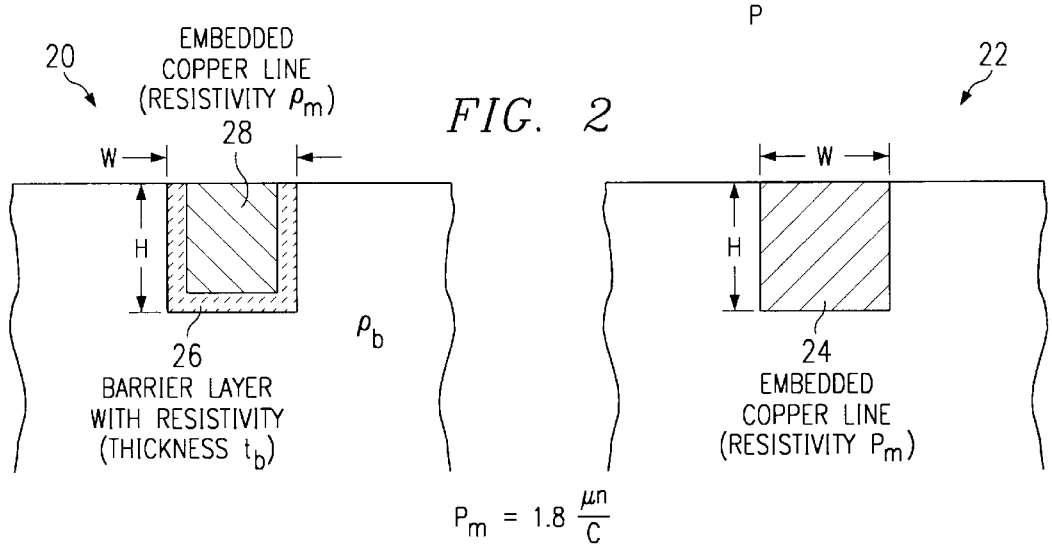
FIGS. 2a and 2b shows two different inlaid copper interconnect lines with and without a conductive barrier layer.
Figure 3:
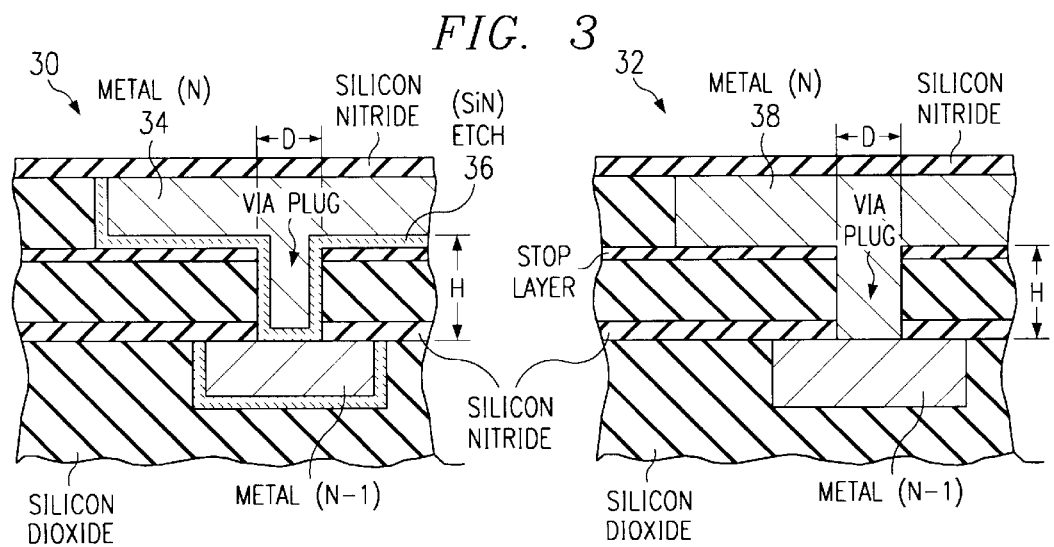
FIGS. 3a and 3b shows two different copper via plugs, one with a barrier layer, the other without a barrier layer, making electrical connections between two metal lines located on two different interconnect levels.
Figure 4A:
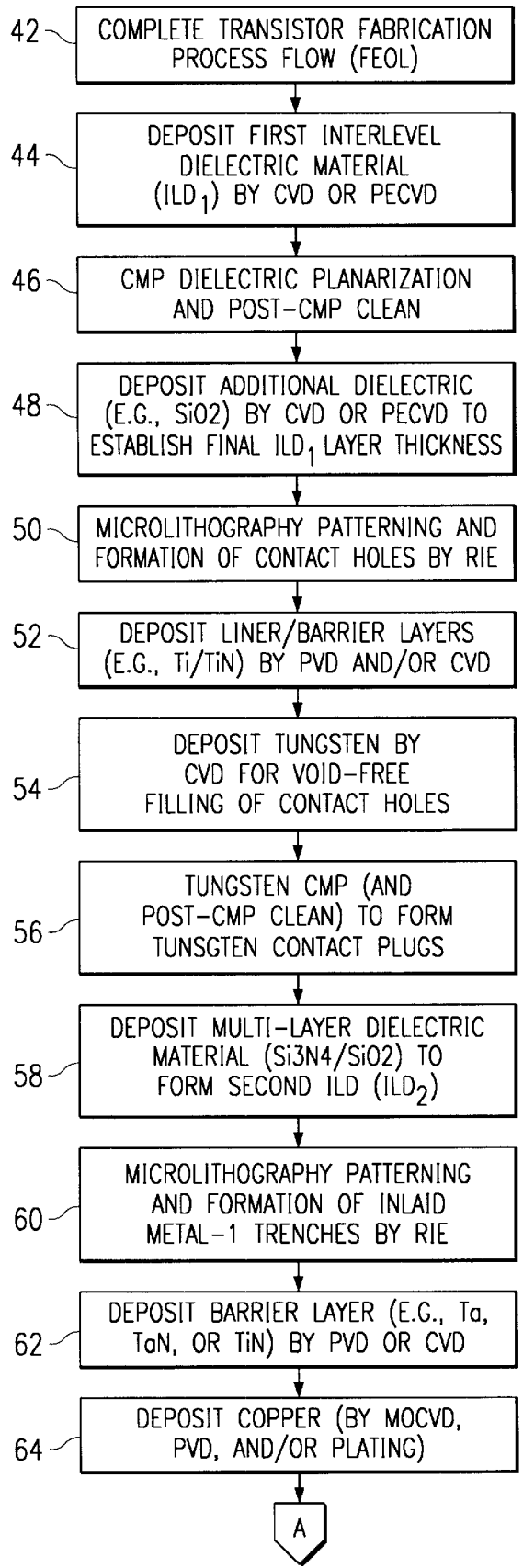
FIGS. 4 and 5 depict exemplary prior art processes for preparing a dual-damascene multi-level copper interconnect structure.
Figure 4B:
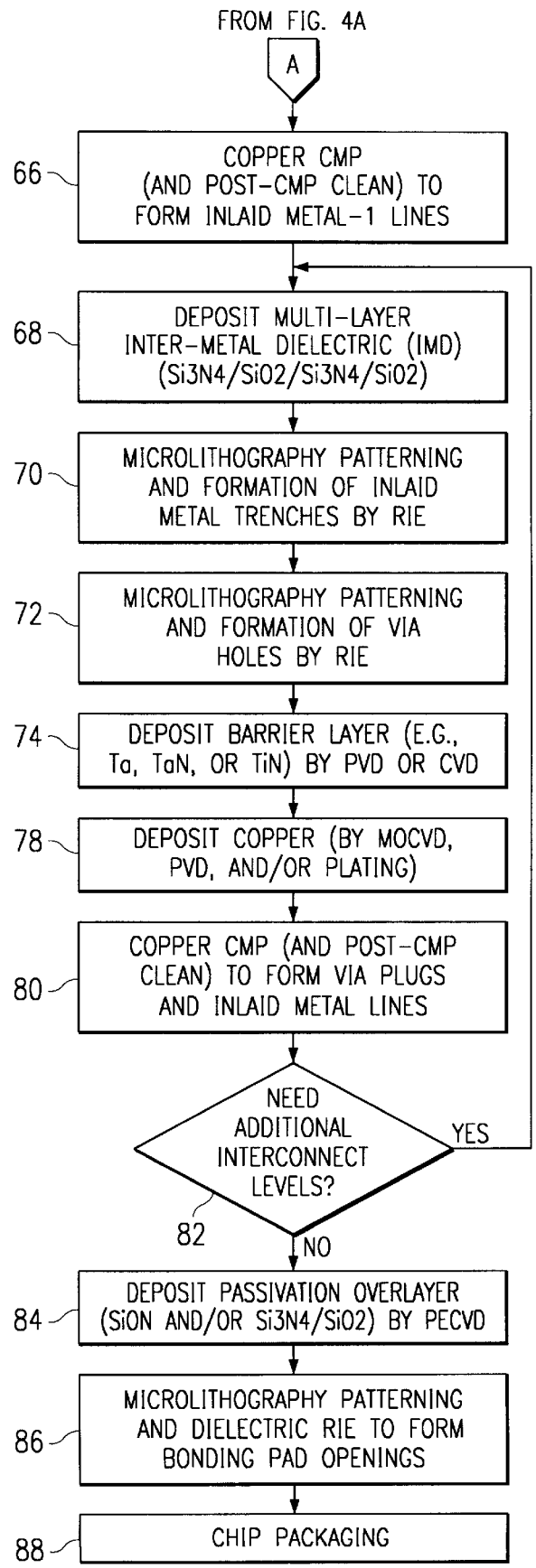

FIG. 4 shows one example of a prior art interconnect process flow 40 that results in a dual-damascene multi-level copper metallization interconnect structure in conjunction with inorganic interlevel dielectric (ILD) and intermetal dielectric (IMD) layers (e.g., fluorinated oxide or $Si_xO_yF_z$ ILD/IMD material). In this example, tungsten is used to form tungsten contact plugs (to keep copper away from silicon) while copper is used for all the via plugs. The interconnect fabrication process (or back-end-of-the-line or BEOL process) flow starts after completion of the front-end-of-the-line (FEOL) process flow utilized for fabrication of the transistor and isolation (and other devices such as diodes, capacitors, etc.) structures, as step 42 indicates.

The first ILD layer (ILD1) which may be $SiO_2$, $Si_xO_yF_z$, or another material) is deposited, as shown in step 44, by thermal CVD or PECVD and then globally planarized by chemical-mechanical polishing (CMP) and cleaned after the CMP step at step 46. Subsequently, the complete ILD structure is formed by deposition using CVD or PECVD of an additional amount of the dielectric material (e.g., $SiO_2$, $Si_xO_yF_z$, or another suitable insulating material), as indicated in step 48. After formation of the contact holes by microlithography and reactive ion etching or RIE as shown in the liner/barrier layers (e.g. Ti/TiN) are formed by PVD and/or CVD (see step 50, step 52). Then the tungsten contact plugs are formed by blanket deposition of a tungsten layer to fill the contact holes (see step 54) followed by tungsten CMP and post-CMP clean as shown in steps 54 and 56. The fabrication flow then continues by deposition of a relatively thick etch-stop layer (e.g. silicon nitride layer) followed by deposition of the second ILD layer (e.g., $SiO_2$ or $Si_xO_yF_z$). The metal-1 (first metal level) line trenches, for subsequent formation of inlaid metal-1 interconnects, are formed by microlithography patterning and RIE (with the thin $Si_3N_4$ etch-stop layer used for RIE process end-pointing) (step 60). $Si_3N_4$ is also removed from the bottom of trenches by RIE. The RIE step used for removal of the silicon nitride layer at the bottom of the trenches selectively removes the nitride layer and stops on ILD1.

Then, the diffusion barrier layer (TiN, Ta, TaN, or another suitable material) is deposited either by CVD or PVD (e.g., to form a 150 Å to 300 Å barrier layer) (step 62). The inlaid metal-1 interconnect lines are then formed by depositing copper (by MOCVD, PVD, and/or plating) followed by subsequent metal CMP and post-CMP clean through steps 64 and 66. The following dual-damascene copper interconnect level is fabricated by depositing the intermetal dielectric (IMD) layer (e.g., a multi-layer dielectric comprising a thin silicon nitride dielectric barrier and etch-stop layer, followed by deposition of $SiO_2$, a thin $Si_3N_4$ etch-stop layer, and a top layer of silicon dioxide ($SiO_2$) layer; the oxide layers may be replaced by a reduced-permittivity material such as $Si_xO_yF_z$), as shown in step 68. Then, a microlithography patterning process and a reactive ion etch (RIE) process sequence is used (step 70) in order to form the dielectric trenches for subsequent formation of inlaid copper metal lines.

A follow-on microlithography patterning and dielectric RIE process sequence is used to form the interconnect via holes (step 72). Then, a diffusion barrier layer (TiN, Ta, TaN, etc.) is deposited by CVD or PVD, (step 74). Subsequently, a copper layer is deposited, as shown in step 78, (by MOCVD, PVD and/or Plating) and polished back by CMP, followed by post-CMP clean (step 80) resulting in formation of the embedded copper via plugs and inlaid metal interconnect lines. The repetitive steps of IMD deposition, microlithograhy patterning and dielectric RIE processes (for via holes and interconnect metal line trenches), as well as barrier and copper deposition steps, and CMP and post-CMP clean are performed multiple times until all the necessary interconnect levels are fabricated, as verified at step 82. Then, the passivation overlayer (e.g., $Si_3N_4$ or SiON) is deposited by PECVD, at step 84. A microlithography patterning step and an RIE process step are used (step 86), to form the bonding pad openings or windows. The chip can then be packaged, as step 88 indicates.

Figure 5A:
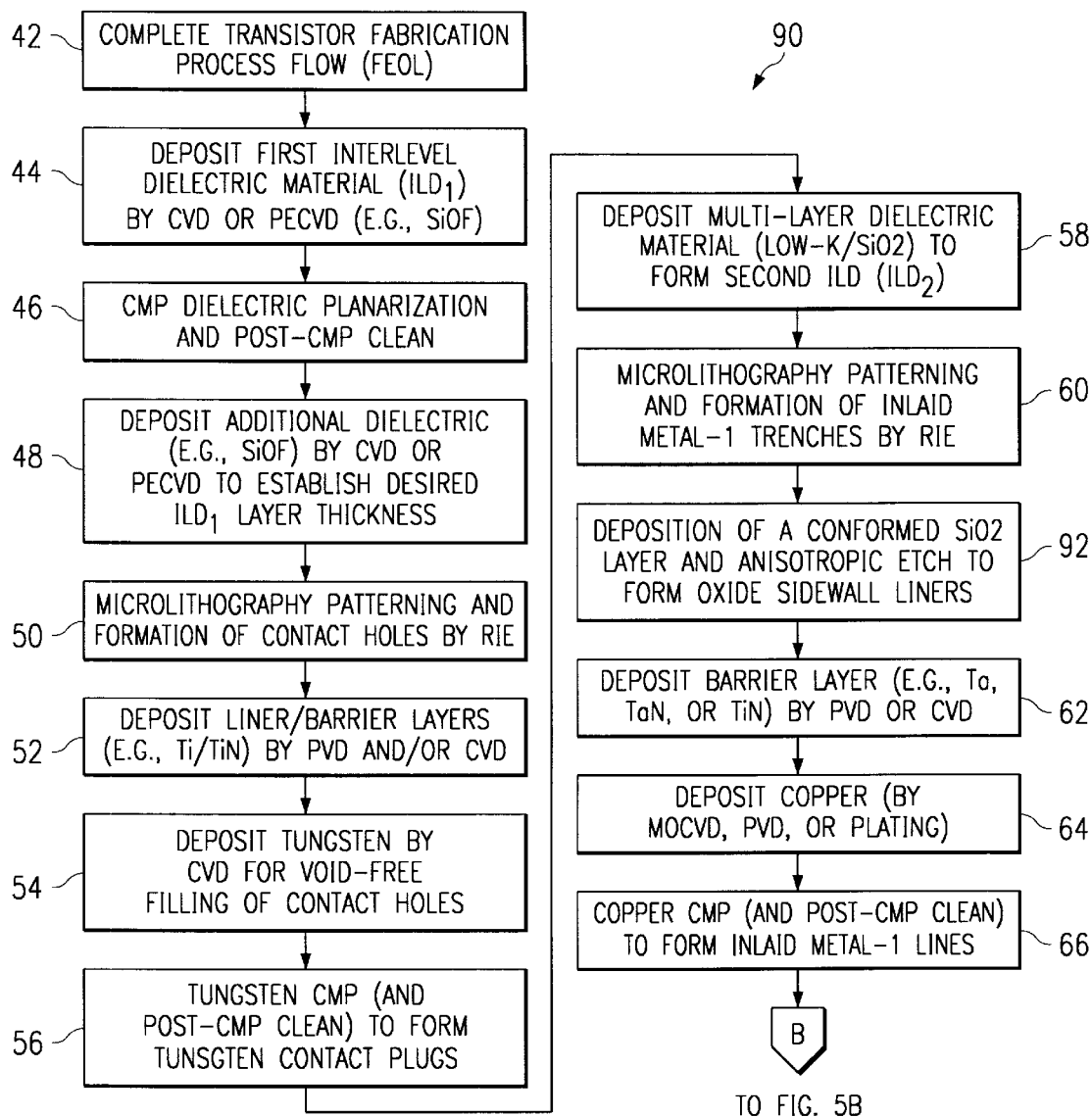
Figure 5B:
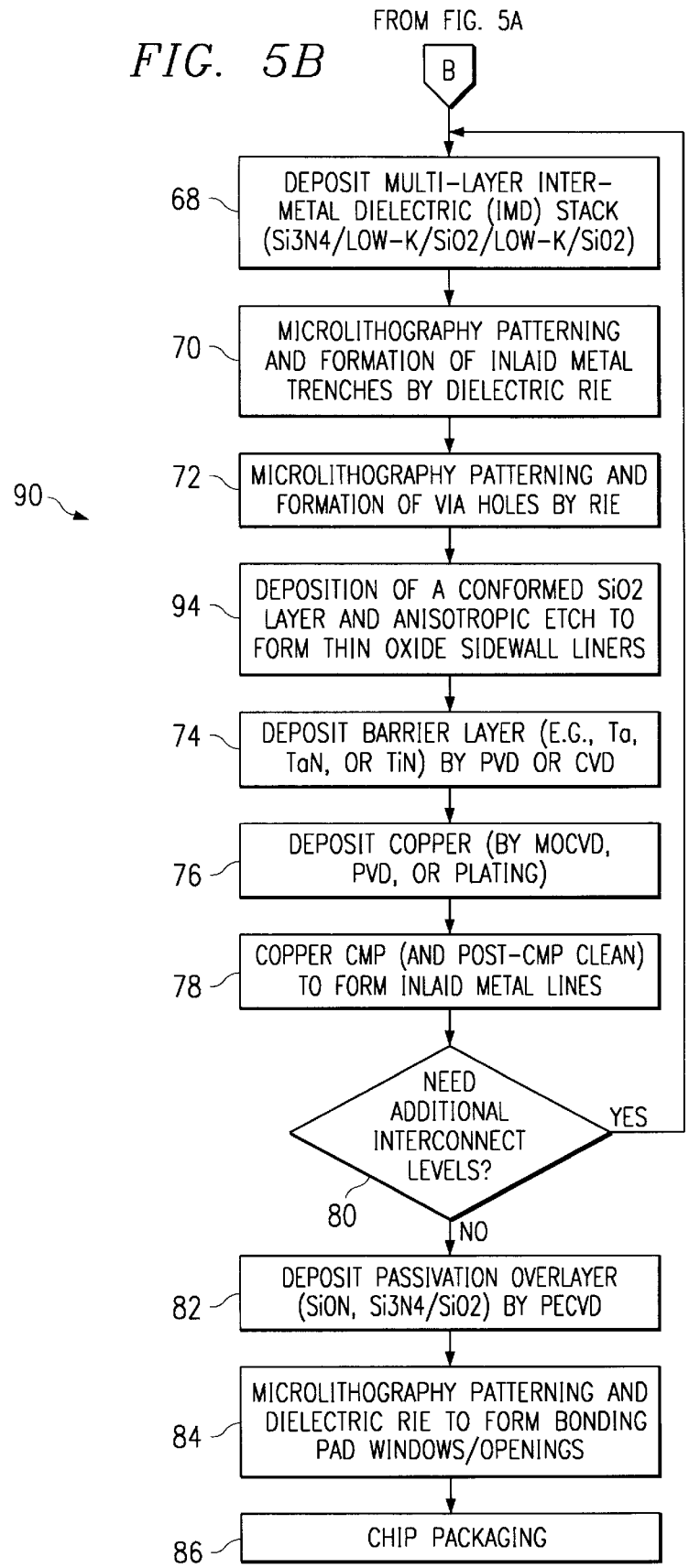

The process flowchart 90 of FIG. 5 presents another example of a state-of-the-art prior art interconnect process technology for formation of dual-damascene copper metallization with advanced low-k (e.g., $K \leq 2.5$) IMD/ILD layers. Process flow 90 is fairly similar to the prior art process flow of FIG. 4 except for additional process steps 92 and 94. The additional process steps 92 and 94 for integration of copper and low-k dielectrics are required in order to maintain good low-k dielectric integrity through the BEOL interconnect process flow and also to eliminate any process integration issues in terms of patterning and etch processes as well as any material compatibility issues. The description of the process flow outlined in FIG. 5 is essentially similar to that already provided for the flowchart in FIG. 4. One difference is that a thin layer of a hard mask material (such as $SiO_2$) is used to protect the ILD or IMD low-k dielectric surface prior to any patterning and CMP process steps.

Most of the organic low-k dielectric materials may be damaged in typical plasma ash processes used for removal of the patterned photoresist layers after patterning and etch processes (thus, the reason for the use of an oxide hard mask). Moreover, many low-k organic dielectrics may not be directly exposed to the CMP pad and slurry due to possible damage or degradation of their properties. This is another reason for using the oxide hard mask to protect the low-k dielectric. Moreover, this process flow forms a thin layer of dielectric (e.g., oxide) liner on the sidewalls of the dielectric trenches and via holes in order to protect a low-k dielectric from plasma etching and also to provide a good sidewall surface for deposition of the barrier layer. For IMD layers, the multi-layer stack comprises $Si_3N_4$, low-k dielectric, thin $SiO_2$, low-k dielectric, and thin $SiO_2$.

The lower and upper low-k dielectric layers house the via plugs and the inlaid interconnect metal lines on each level, respectively. The lower silicon nitride layer (thin nitride) is used as a dielectric diffusion barrier to encapsulate the lower level copper interconnect lines. The middle thin $SiO_2$ layer is used as an etch-stop layer during the formation of the metal trenches. A comparison of process flow 40 of FIG. 4 with process flow 90 of FIG. 5 indicates that integration of advanced low-k dielectric materials (such as organic low-k materials) results in added process complexity and increased IC fabrication cost compared to standard silicon dioxide IMD material or its related materials (such as fluorinated oxide).

Figure 6B:
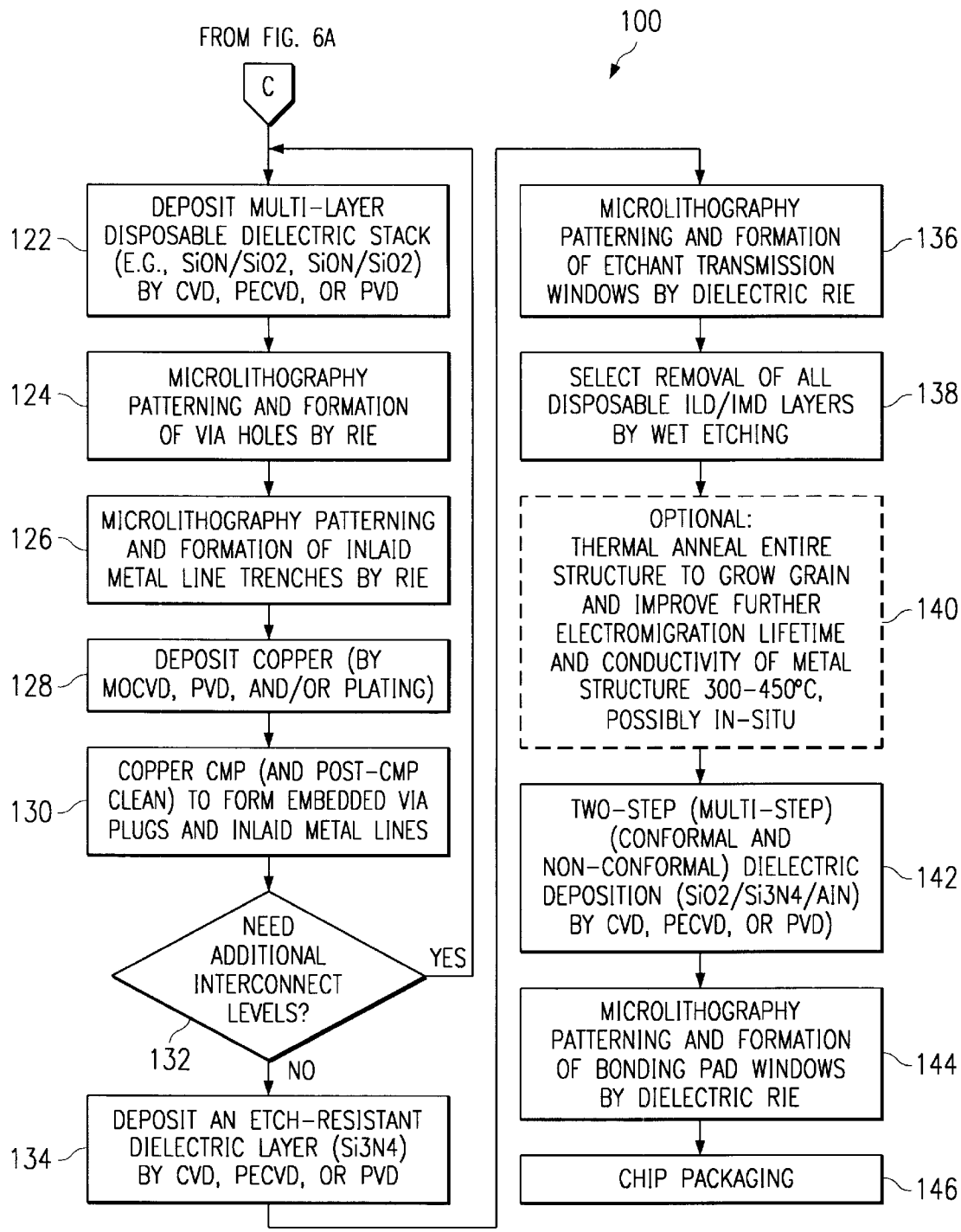
FIG. 6 is a process flow for one embodiment of the present invention (example shown for formation of a multi-level copper interconnect structure with free-space dielectric medium)
Figure 7B:
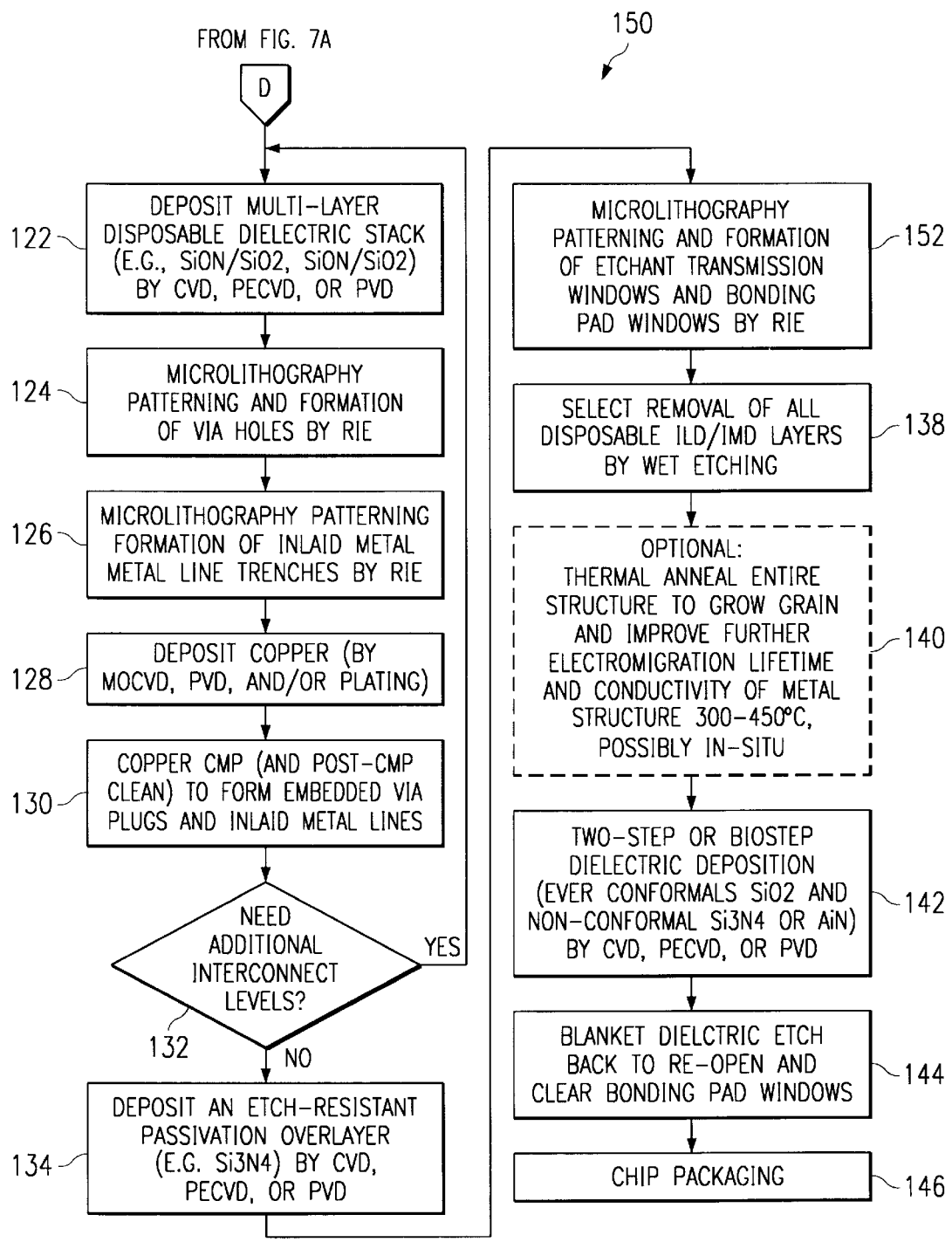
FIG. 7 provides an alternative process flow for another embodiment of the present invention, different in some respects to that of FIG. 6 (again example shown for formation of a multi-level copper interconnect structure with free-space dielectric medium)

The following discussion focuses on the description of the interconnect process flows and structures of the present invention appearing in FIGS. 6 and 7. Two closely related preferred flows of invention (preferred process flow embodiments) are shown in the flowchart 100 of FIG. 6 and flowchart 150 of FIG. 7. First, the description focuses on the process flow 100 of FIG. 6. The back-end-of-the-line (BEOL) interconnect process flow starts after completion of the front-end-of-the-line (FEOL) fabrication process flow for the transistors, isolation regions, etc. (step 102). The next step is to deposit a blanket layer of a suitable dielectric diffusion barrier material which is also highly resistant against typical etch chemistries (e.g., HF-based etchants) used for oxide etching. For instance, it is possible to preferably deposit a layer of silicon nitride (e.g., 2000 Å to 5000 Å $Si_3N_4$) using thermal CVD, PECVD, or PVD (step 104). This layer will serve as a dense etch-resistant layer used for protection of the active transistor devices and isolation structures during subsequent etching of the disposable inter-level and inter-metal oxide layers. Moreover, this thick and dense etch-resistant dielectric barrier layer prevents any copper diffusion into the silicon substrate and active device regions during the BEOL interconnect processing. Other suitable dielectric materials (e.g., AlN or diamond-like carbon or DLC) may be used instead of $Si_3N_4$ for this material layer. After the blanket dielectric deposition process, the first disposable interlevel dielectric ($ILD_1$) layer is deposited (step 106). This involves preferably a silicon dioxide layer to be deposited by CVD, PECVD, or even PVD at step 108. Next, dielectric CMP and post-CMP cleaning processes are performed (step 108) to form a globally planarized dielectric surface. This will provide a globally planar wafer surface throughout the multilevel interconnect fabrication process flow. Subsequently, a multi-layer disposable dielectric stack (e.g., $SiO_2/SiON/SiO_2$) is deposited by CVD, PECVD, or PVD (step 110).

The stack includes upper and lower silicon dioxide layers separated by a thin etch-stop (or etch end-point detection) layer of a different material such as silicon oxynitride (SION) or aluminum oxide ($Al_2O_3$) or another suitable disposable material. The thin intermediate layer of oxynitride will be used an etch end-point marker during subsequent formation of the metal line trenches by anisotropic reactive-ion etching. After deposition of the multi-layer stack, a microlithography patterning process and subsequent dielectric RIE (anisotropic etching) process are performed, as shown at step 112, to form the contact holes. Then, another microlithography patterning process and an anisotrophic RIE process are used to form the dielectric trenches for the first level of metal interconnect lines (step 114). Next, the first level metallization is performed by sequential deposition of the barrier layer (e.g., Ta, TaN, $WN_x$, or TiN by PVD or CVD) as shown in step 116, and a copper layer (by MoCVD, PVD, and/or plating), as indicated in step 118. Then, copper CMP and post-CMP clean processes are performed (step 120), in order to form the embedded copper contact plugs and inlaid metal lines.

Next, fabrication of the next interconnect level proceeds by deposition of a suitable multi-layer disposable dielectric stack, preferably $SiON/SiO_2/SiON/SiO_2$, formed by CVD, PECVD, or PVD (step 122). The silicon oxynitride (SiON) layers are relatively thin compared to the upper and lower $SiO_2$ layers (e.g., 100 Å to 500 Å) and are used as etch-stop layers during subsequent RIE etch processes for formation of the via holes and metal line trenches. Other suitable materials such as aluminum oxide may be used instead of SiON as etch-stop layers. After the multi-layer stack deposition, two sequential steps of microlithography patterning and anisotropic RIE processes (steps 124 and 126) are performed for formation of the via holes and the interconnect metal line trenches. Next, a layer of copper is deposited (step 128), by MOCVD, PVD, and/or plating to fill the via holes and interconnect metal line trenches. Note that at this stage copper can be deposited directly on the patterned structure without a need for a diffusion barrier layer, thus, simplifying the interconnect process flow. If desired or necessary, an adhesion promotion glue layer may be deposited on the surface prior to deposition of copper.

Figure 8:
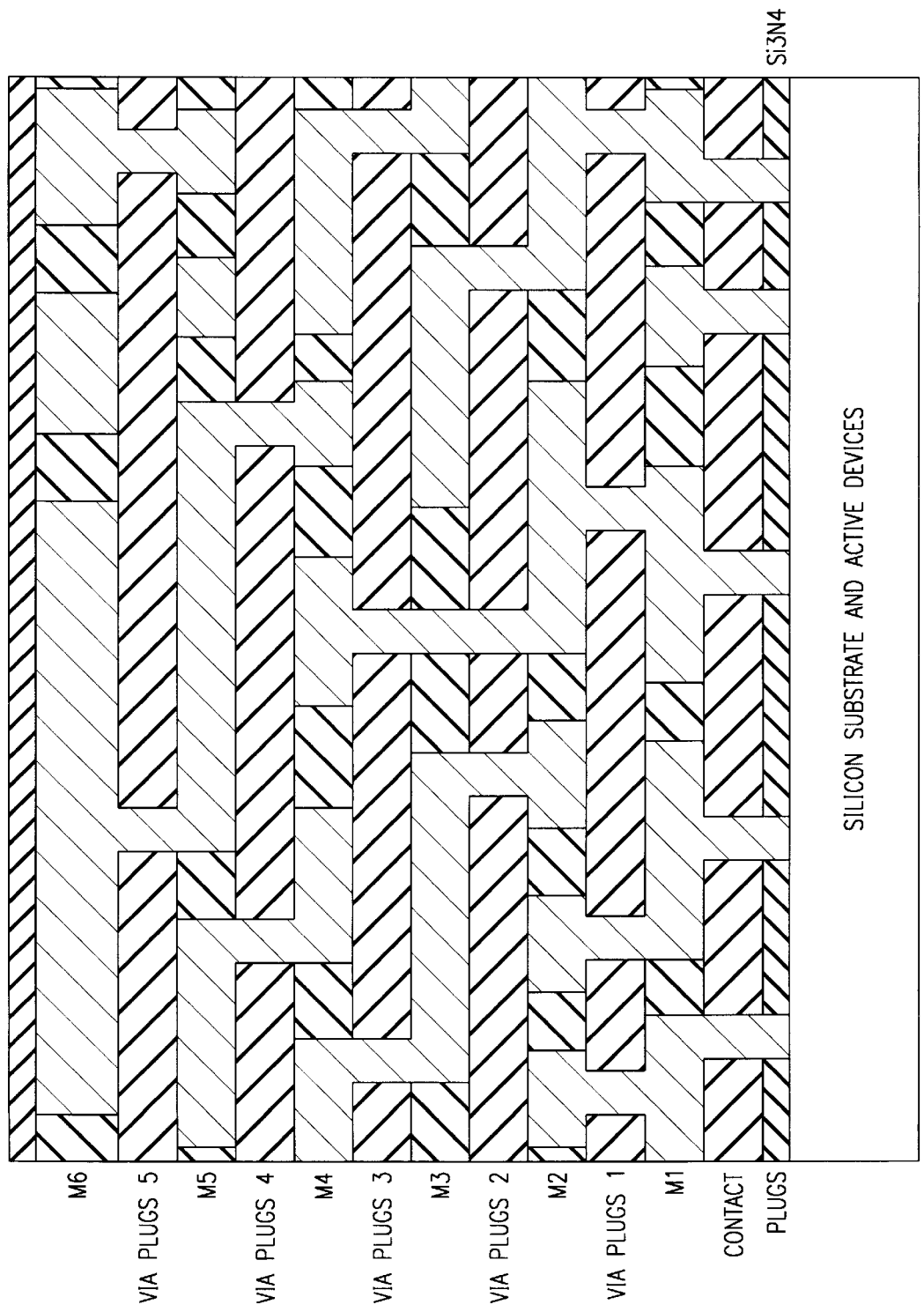
FIG. 8 shows a multi-level interconnect structure formed as part of the process of the present invention (interconnect structure shown prior to completion of the final process steps for formation of free-space medium and hermetic sealing of the IC chips)

Subsequently, copper CMP and post-CMP clean processes are performed, at step 130, in order to form the embedded via copper plugs and inlaid interconnect metal lines. The repetitive steps of multi-layer dielectric stack deposition, fabrication of via holes and metal line trenches, copper deposition, and copper CMP (and post-CMP clean) are performed multiple times until all the necessary interconnect levels are fabricated, as verified at step 132. After formation of all the necessary interconnect levels, a top etch-resistant dielectric layer, preferably a silicon nitride layer (on the order of 2000 Å to 1 µm thick), is deposited by CVD, PECVD, or PVD, at step 134. Other suitable etch-resistant (and preferably high-thermal-conductivity dielectric materials) such as aluminum nitride or diamond-like carbon (DLC) may also be used instead of silicon nitride. The schematic diagram of FIG. 8 illustrates the example of a cross-sectional view of a multi-level interconnect structure (shown with six levels of copper interconnect) at this stage in the interconnect fabrication process flow.

Figure 9:
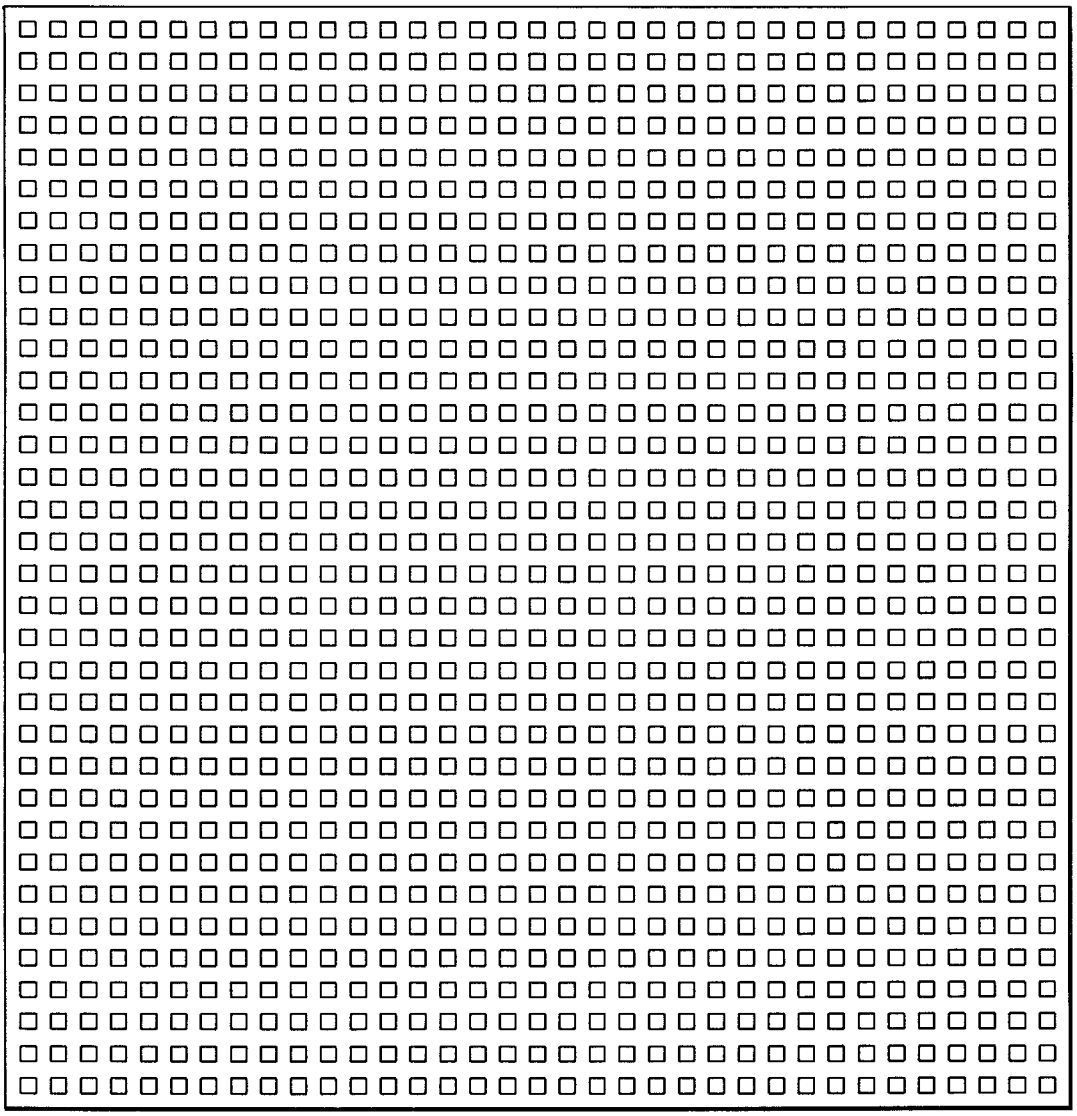
FIGS. 9 through 12 show alternative embodiments of the top layer etchant transmission openings or windows for fabrication of the free-space dielectric interconnect structure of the present invention.
Figure 10:
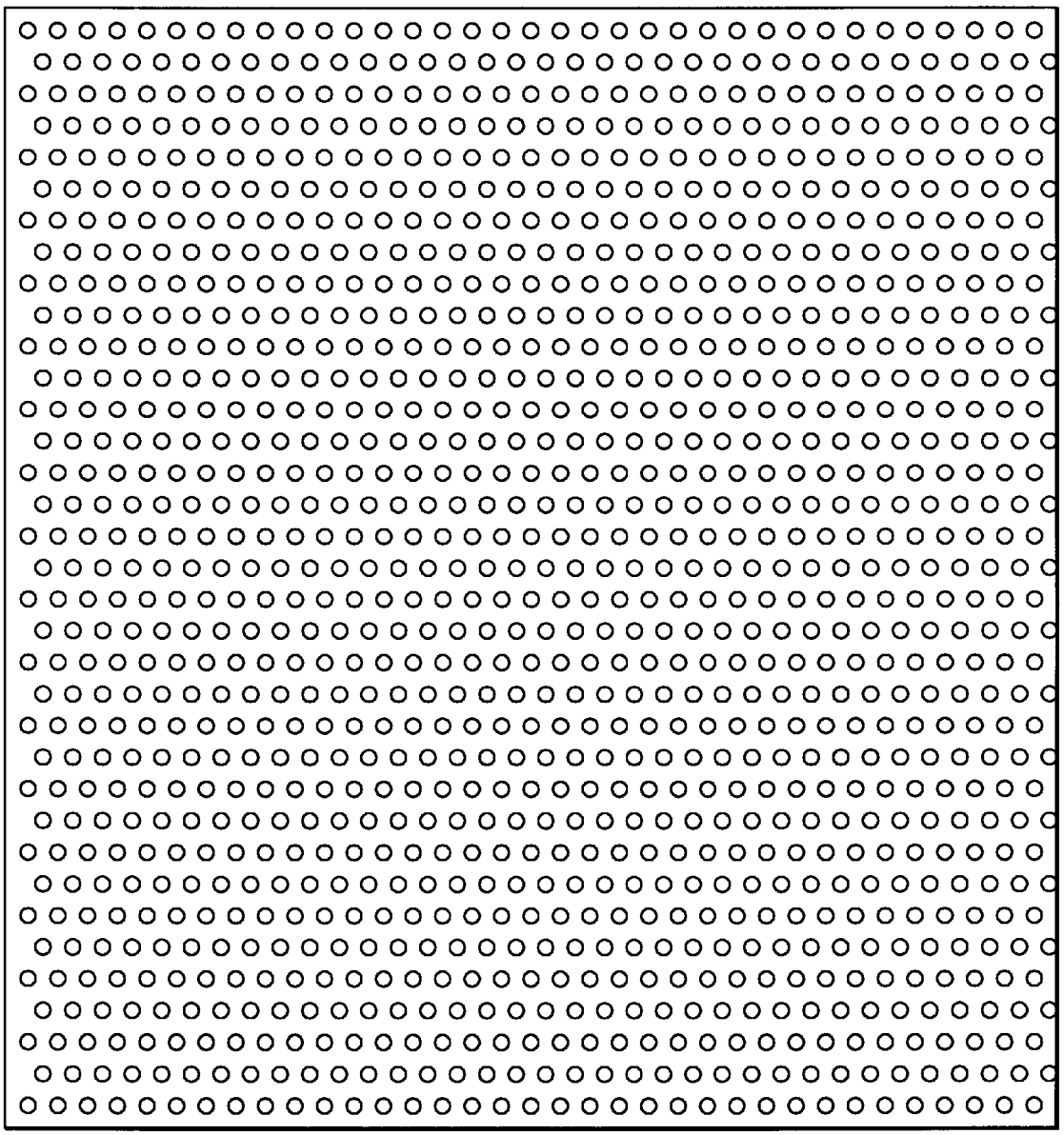
Figure 11:
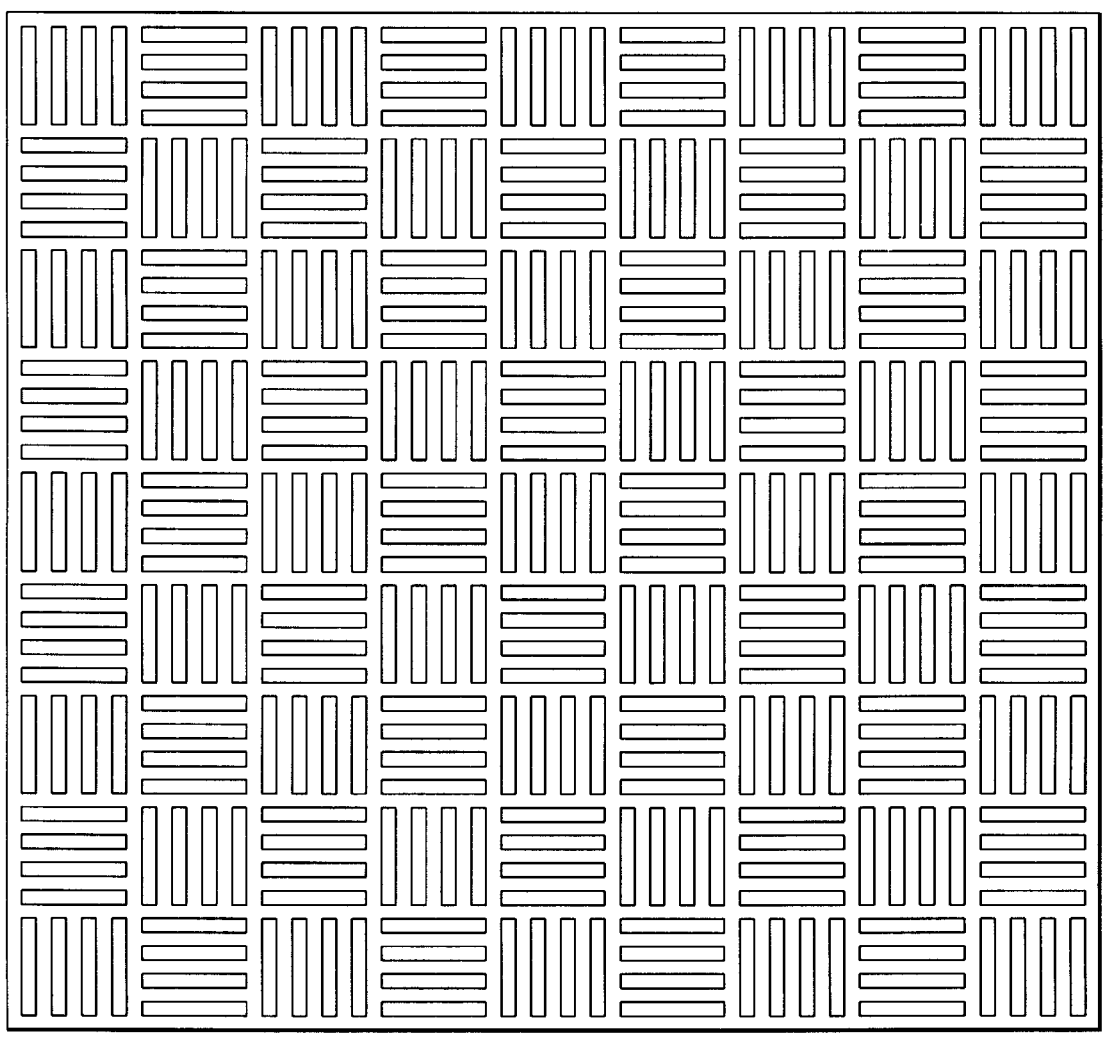
Figure 12:
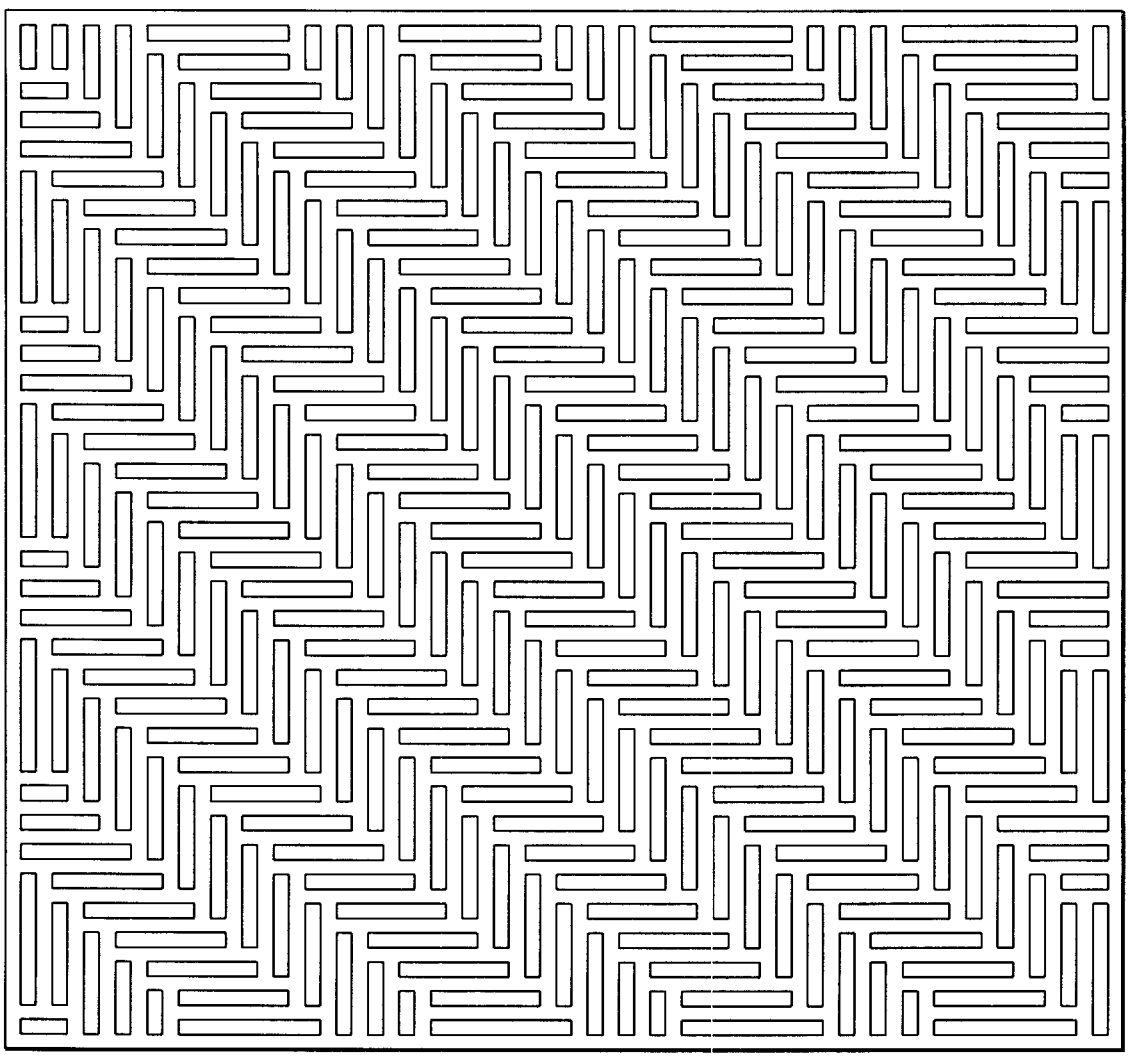

Next, a microlithography patterning process and a subsequent anisotropic RIE process are performed (see step 136) in order to form etchant transmission windows or openings within the top dielectric layer. The schematic diagrams on pages FIGS. 9, 10, 11 and 12 show several possible layout patterns of the etchant transmission windows, formed within the top etch-resistant dielectric layer. Preferably, the etchant transmission window pattern comprises openings or windows (squares, rectangular, circular, etc.) with at least one minimum-geometry in-plane dimension. For instance, the pattern of FIG. 9 shows an array of closely-spaced square windows. For a 0.18 µm technology node, these windows may have 0.18 µm×0.18 µm areas and the adjacent windows may be separated by 0.18 µm. The alternative pattern in FIG. 10 comprises an array of circular holes. Again, the holes may have minimum-geometry diameters (e.g., 0.18 µm diametric dimensions for circular holes separated by 0.18 µm from each other in a 0.18 μm technology). FIGS. 10 and 11 show two alternative etchant transmission window patterns comprising rectangular windows with larger overall transmission window area ratios (ratio of total area of the windows to the total surface area). The smaller side dimensions of these rectangular windows are preferably the same as the resolution of the microlithography tool (e.g., 0.18 μm for a 0.18 μm technology), while the larger side dimensions (lengths of rectangular windows) may be several to tens to even hundreds of microns (μm). The idea is to have an etchant transmission window pattern which provides a relatively large transmission area ratio (preferably a ≧50%) and can be subsequently hermetically sealed using a simple deposition process without a significant impact on the interconnect metallization structure. Preferably, the thickness of the top etch-resistant layer (e.g. $Si_3N_4$ or AlN layer deposited by CVD, PECVD, or PVD or any other vapor deposition process) is several times larger than the smaller side dimension of the etchant transmission unit cells. For instance, for a 0.18 μm technology, we may use a 0.70 μm-to-1 μm thick silicon nitride top etch-resistant layer with etchant transmission window cells (square, circular, rectangular, or any other shape) which have 0.18 μm minimum in-plane dimension (e.g., rectangular unit cells, with 0.18 μm×5 μm window size).

Returning to FIG. 6, a highly selective etch (preferable a wet etch process such as HF-based etch) is performed at step 138 in order to selectively remove the entire multi-level disposable silicon dioxide dielectric structure. This etch chemistry and the resulting etch byproducts easily pass through the etchant transmission windows (or unit cells) facilitating the etch process. Due to the high packing density of the transmission unit cells and their relatively large area ratio, the selective etchant can easily remove the entire multi-level oxide and oxynitride dielectric stack bound between the lower etch-resistant layer (e.g., silicon nitride or aluminum nitride or DLC) and the upper etch-resistant patterned (e.g., also silicon nitride, aluminum nitride, or DLC) layer. The selective etchant (e.g., HF-based wet etchant) does not or should not attack the metallization structure and may remove only a very small fraction of the top and bottom etch-resistant layers (e.g., silicon nitride, aluminum nitride, or DLC). For instance, with a wet etch selectivity of 100:1 for oxide with respect to silicon nitride, removal of an equivalent oxide thickness of 10 μm (for removal of multi-level oxide and buried oxynitride layers plus some overetch), results in removal of about 0.1 μm silicon nitride from the top and bottom etch-resistant layers. This also results in enlargement of the etchant transmission windows (for instance, the 0.18 μm wide rectangular unit cells grow towards ~0.38 μm wide windows).

Figure 13:
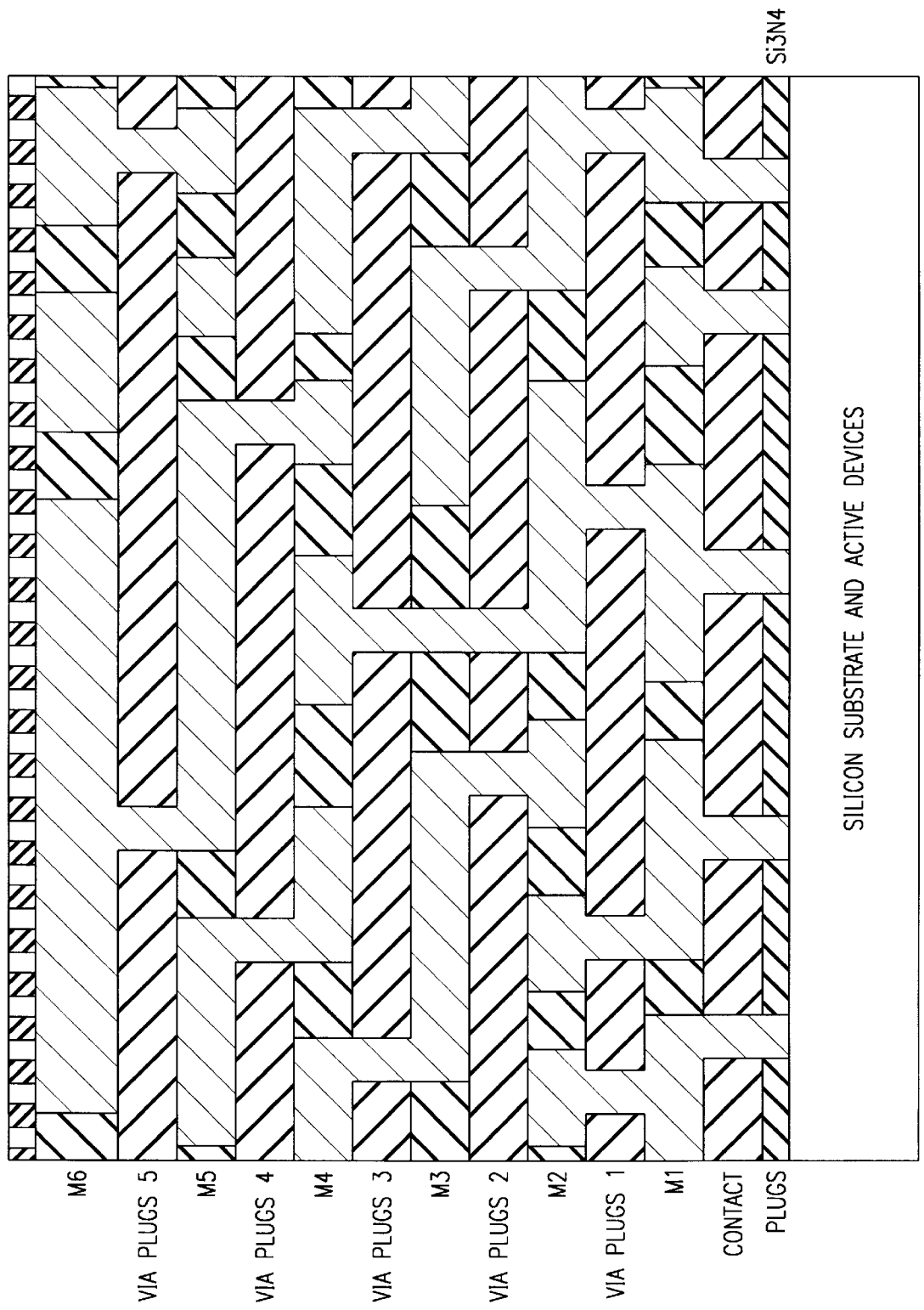
FIG. 13 depicts the interconnect structure of FIG. 8 following formation of the etchant-transmission window pattern on the top layer and after formation of the free-space dielectric medium for the purposes of illustrating one example of forming the free-space dielectric interconnect structure of the present invention.

In general, the preference is to use an etchant with sufficiently high selectivity (>100:1) to the disposable ILD/IMD materials compared to the etch-resistant material which limits the thickness removal of the top and bottom etch-resistant layers (e.g., silicon nitride or aluminum nitride or DLC or another suitable dielectric) to preferably <1000 Å. The schematic cross-sectional diagram of FIG. 13 shows the resulting device structure after the selective removal of the disposable oxide dielectric layers. As shown, the multi-level copper interconnect structure is now surrounded by free-space medium within the structure between the top and bottom etch-resistant (e.g., silicon nitride) layers. The multi-level copper interconnect structure is mechanically supported by its own line and plug interconnections as well as the top and bottom boundary planes defined by the top and bottom etch-resistant silicon nitride layers which have sealed contacts to the top metal level and bottom contact plugs, respectively. If desired, a plurality of metallic columns made of stacked dummy contact and via plugs may be used to provide additional mechanical support between the top and bottom etch-resistant layers (this is optional but not necessary.)

At this stage, it is possible to perform an optional thermal anneal as shown at step 140 (e.g., at a temperature between 250° C. and 400° C.) in order to form large grains and preferred highly oriented texturing in the interconnect structure for improved electromigration lifetime, and enhanced metallization conductivity as well as to relieve any residual stresses. This optional thermal anneal process may also be used to form a large-grain multi-level copper metallization system with "bamboo-type" microstructure for maximum electromigration lifetime reliability improvement.

Next, the process flow continues with at least one deposition process and preferably two sequential material deposition process steps, as indicated at step 142. The first deposition process is a substantially conformal (CVD or PECVD) deposition process for deposition of a controlled thickness (e.g., 50 Å to 200 Å) of a dielectric material such as $SiO_2$, $Si_3N_4$, AlN, $Al_2O_3$, etc. The preferred material is silicon dioxide. This conformal deposition process deposits a thin (e.g., 50 Å to 200 Å) layer of encapsulating dielectric material such as $SiO_2$ over all the exposed surface areas of the multi-level metallization structure (metal lines and plugs). This deposition process also deposits a thin layer of the conformal dielectric over the exposed surfaces of the top etch-resistant patterned dielectric (e.g., silicon nitride), including the etchant transmission windows as well as a thin layer over the bottom etch-resistant layer. The amount of conformal dielectric thickness can be deliberately chosen to be small enough such that it is not sufficient to completely seal the etchant transmission windows or the top patterned etch-resistant insulator.

The main purpose of this conformal dielectric (e.g., silicon dioxide) deposition step is to prevent or suppress thermionic emission and/or low-voltage electrical breakdown between the adjacent intra-level and inter-level metal lines and/or plugs through the free-space medium. The second deposition step is preferably a substantially nonconformal or directional deposition step (with poor step coverage) used to form a hermetically-sealed top insulating passivation overlayer. For instance, either PVD (plasma sputtering) or nonconformal PECVD (or other processes such as jet-vapor deposition or laser ablation) can be used to deposit a layer comprising silicon nitride, aluminum nitride, silicon oxynitride, diamond-like carbon (DLC), boron nitride or any combination of them. Preferably, the deposited material has excellent diffusion barrier properties against ionic contamination and moisture, and also has a relatively high thermal conductivity. For instance, this nonconformal or directional deposition may involve an atmospheric deposition process (preferably a thermal CVD process with helium carrier gas or an atmospheric laser ablation deposition process using a suitable target material in an inert atmosphere) for deposition of silicon nitride, aluminum nitride, DLC, or another suitable material.

The schematic diagrams shown in FIG. 14 show an example of the evolution of the top dielectric layer starting from a patterned layer comprising etchant transmission windows and ending as a hermetically-sealed structure with fully sealed windows (the top and bottom figures show the cross-sectional diagrams of the top dielectric layer before and after the conformal/non-conformal dielectric deposition processes).

Another practical process sequence for the hermetic sealing of the interconnect structure is as follows: (i) perform an atmospheric low-temperature silicon dioxide deposition (partially conformal) step using $SiH_4/N_2O$ in a helium carrier gas in order to deposit a thin layer of oxide on the metallization structure and to seal the etchant transmission windows; (ii) Deposit a layer of silicon nitride (or silicon oxynitride) as passivation overlayer (this may be a ~5000 Å thick layer deposited by PECVD); (iii) Deposit a layer (e.g., 5000 Å to over 1 μm thick layer) of high-thermal conductivity insulating material, preferably aluminum nitride or DLC, by a suitable deposition process (preferably RF magnetron sputtering or PECVD). This exemplary process sequence results in complete hermetic sealing of the chip interconnect structure by reproducing a continuous top passivation layer. Moreover, this process sequence results in a helium-filled free-space intermetal/interlevel dielectric medium. The atmospheric helium free-space dielectric medium provides an excellent heat transfer medium within the multi-level interconnect structure; it also further suppresses any thermionic emission (resulting in electrical leakage currents) or gas breakdown effects due to the intra-level and inter-level voltages between the adjacent metal lines and conductive plugs.

The example above shows the typical process flow for formation of a hermetically-sealed continuous dielectric layer on the top in conjunction with a hermetically sealed helium-filled (e.g., at or near atmospheric pressure) free-space interlevel/intermetal dielectric medium. If desired, the free-space helium pressure can be increased to above atmospheric pressure (e.g., 1 to 5 atmospheres) by performing the directional deposition (e.g., laser ablation) process (see FIG. 14) in a pressurized process chamber filled with higher pressure helium. It is, however, emphasized that the preferred method and structure of this embodiment employ atmospheric or near-atmospheric helium (or another suitable inert gas such as argon) to fill the sealed free space interconnect dielectric ILD/IMD volume. Lower helium gas pressures (e.g., 1 Torr to 1 atm.) as well as other types of gas (e.g., argon, nitrogen, hydrogen, etc.) may be used to fill the free-space region.

A gas-filled free-space dielectric region is preferred over a near-vacuum free-space medium, both due to thermal management (efficient heat removal) and dielectric breakdown considerations. For instance, a helium-filled free-space medium 16 (preferably at or near atmospheric He pressure) provides a much superior heat transfer medium (in conjunction with the high-thermal conductivity copper metallization structure as well as the high-thermal-conductivity top and bottom etch-resistant layers), a superior breakdown-resistant interconnect structure, and a better thermionic-emission-resistant free-space medium compared to a vacuum free-space medium.

Figure 15:
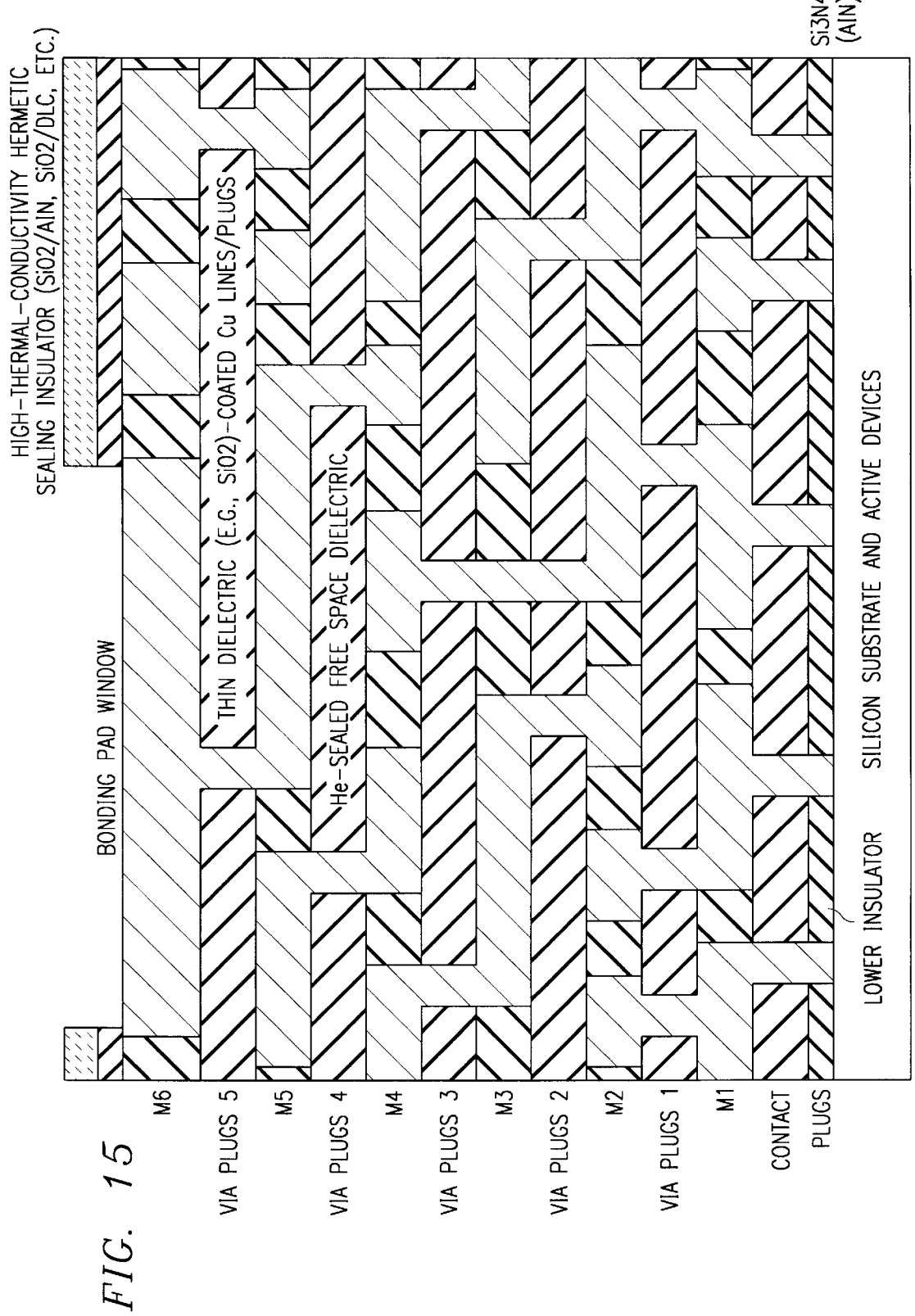
FIG. 15 shows the multi-level interconnect structure of the present invention after formation of the free-space dielectric medium, hermetically-sealed top layer, and the bonding pad windows.

As indicated in the process flowchart of FIG. 6, the next fabrication module is a microlithography patterning step (step 144), followed by an anisotropic dielectric RIE process in order to form the bonding pad windows by etching openings in the top passivation overlayer. The schematic diagram on FIG. 15 shows the multi-level copper interconnect structure after this patterning and etch step. This structure includes multi-level copper interconnects bound between the bottom dielectric diffusion barrier layer and the top high-thermal-conductivity hermetic sealing layer. The metallization structure is surrounded by a sealed free-space medium filled with an inert gas such as helium.

Finally, the wafer is ready for dicing and packaging, at step 146 (such as flip-chip packaging). Note that the multi-level interconnect structure is fully hermetically sealed with an embedded free-space (preferably filled with He) ILD/IMD medium. This structure provides the highest level of interconnect electrical performance and reliability lifetime far superior to any interconnect structure comprising other low-k dielectric materials.

The process flow of the preferred embodiment of the present invention employs one extra microlithography masking step for formation of the etchant transmission windows in the top etch-resistant layer. The process flow of FIG. 6 shows that two separate masking steps are used for formation of the etchant transmission windows and the bonding pad windows (resulting in the need for one extra masking step).

Alternatively, as shown in the alternative process flow 150 of FIG. 7, it is possible to reduce the number of microlithography masking steps by one, through combining the microlithography patterning steps for the etchant transmission windows and bonding pads.

Process flow 150 of FIG. 7 is essentially similar to the first embodiment (shown in FIG. 6) through the copper CMP and post-CMP cleaning processes for the last (topmost) level of copper interconnect, i.e. step 132. Next, the top etch-resistant dielectric layer (or multi-layer material stack) is deposited by CVD, PVD, and/or PECVD, at step 134. For instance, it is possible to deposit either a layer of dense silicon nitride (e.g., 5000 Å to ~1 μm thick) by PECVD and/or PVD, or a bi-layer of $Si_3N_4/AlN$ (e.g., 5000 Å to over 1 μm silicon nitride followed by 5000 Å to over 1 μm aluminum nitride) by PECVD and/or PVD. Then a microlithography patterning process and a subsequent anisotropic dielectric RIE process are performed sequentially to form the etchant transmission windows (corresponding to a suitable pattern such as one of those examples shown in FIGS. 9–12), and also the bonding pad windows at step 152. Note that this masking step combines the layouts of the etchant transmission windows and the bonding pads into one microlithography mask.

Next, the disposable silicon dioxide ILD/IMD layers are selectively removed using a highly selective wet etchant at step 138. This results in the multi-level interconnect structure with free-space ILD/IMD medium surrounding the intercconect structure. Next, the copper metallization structure is coated with a controlled thin layer (e.g. 50 Å to 200 Å) of silicon dioxide (or silicon nitride or another preferably insulating material) and the interconnect structure is hermetically sealed using the multi-step (e.g., two or three step) conformal/nonconformal dielectric deposition processes (step 142), as described in detail in association with FIG. 6. The next fabrication process step is a blanket plasma (e.g., RIE) dielectric etch-back process until the bonding pads are re-exposed, at step 144.

This etch-back process, at step 144, can be easily end-pointed using an optical etch end-point detection method (e.g., laser reflectance endpoint). Finally, the wafer is diced into IC chips and the chips are packaged using a suitable packaging technology. Based on this alternative second embodiment of this invention, the total number of microlithography masking step for an N-level interconnect structure is 2N+1, which is the same as the number of masks required in conventional prior art interconnect process flows. The first embodiment of this invention (shown in FIG. 6) employs 2N+2 microlithography masking steps.

Although the present invention has been described in detail, it should be understood that various changes, substitutions and alterations can be made hereto without departing from the spirit and scope of the invention as defined by the appended claims.

What is claimed is:

1. A multi-level interconnect structure for a semiconductor integrated circuit chip on a semiconductor substrate comprising:
   a plurality of electrically conductive metallization levels, each of said metallization levels comprising a plurality of electrically conductive interconnect segments;
   a plurality of electrically conductive plugs for electrically connecting between various metallization levels and between said metallization levels and a plurality of semiconductor devices;
   a free-space medium occupying at least a substantial portion of the electrically insulating regions within said multi-level interconnect structure; and
   an electrically insulating top passivation overlayer for hermetic sealing of said multi-level interconnect structure and for protection of said integrated circuit chip, said top passivation overlayer also serving as a heat transfer medium for facilitating heat removal from said interconnect structure and providing additional mechanical support for said interconnect structure through contact with the top metallization level of said multi-level interconnect structure.

2. The multi-level interconnect structure of claim 1 wherein said top passivation overlayer is formed to substantially maintain said free space medium.

3. The multi-level interconnect structure of claim 1 wherein at least a portion of said electrically conductive plugs is made of copper, and wherein at least a portion of said electrically conductive interconnect segments is made of copper.

4. The multi-level interconnect structure of claim 1 wherein at least a portion of said electrically conductive interconnect segments and plugs is made of a material comprising silver or aluminum.

5. The multi-level interconnect structure of claim 1 wherein at least a portion of said electrically conductive interconnect segments and plugs is made of a material comprising a superconducting material.

6. The multi-level interconnect structure of claim 1 wherein said semiconductor substrate is silicon, or silicon-on-insulator, or galium arsenide.

7. The multi-level interconnect structure of claim 1 wherein said electrically insulating top passivation overlayer is made of a material comprising silicon nitride, silicon oxynitride, aluminum nitride, diamond-like coating, boron nitride or silicon carbide.

8. The multi-level interconnect structure of claim 1 wherein said electrically insulating top passivation overlayer comprises a material layer with a plurality of open bonding pad windows and closed resealed windows, the latter used for formation of said free-space medium and subsequent hermetic sealing of said interconnect structure.

9. The multi-level interconnect structure of claim 1 wherein said multi-level interconnect structure is further supported by an electrically insulating bottom buffer layer, said electrically insulating bottom buffer layer separating said multi-level interconnect structure from underlying transistors and isolation regions fabricated within said semiconductor integrated circuit chip substrate.

10. The multi-level interconnect structure of claim 9 wherein said top passivation overlayer provides openings to expose the electrically conductive bonding pads and said electrically insulating bottom buffer layer provides openings for electrical connections between a portion of said electrically conductive plugs and said underlying transition within said semiconductor substrate.

11. The multi-level interconnect structure of claim 9 wherein said multi-level interconnect structure provides mechanical stability through a plurality of interconnections among said electrically conductive interconnect segments and plugs, binding connections between said top passivation overlayer and a portion of the top metallization level, as well as binding connections between a portion of said electrically conductive plugs and said electrically insulating bottom buffer layer.

12. The multi-level interconnect structure of claim 9 wherein said plurality of electrically conductive levels and plugs is embedded within a sealed cavity formed between said top passivation overlayer and said electrically bottom buffer layer in conjunction with a free-space dielectric medium.

13. The multi-level interconnect structure of claim 9, wherein said electrically insulating bottom buffer layer is made of a material comprising silicon nitride, aluminum nitride, diamond-like coating, silicon carbide, or boron nitride.

14. The multi-level interconnect structure of claim 9, wherein said electrically insulating bottom buffer layer provides additional mechanical support for said multi-level interconnect structure.

15. The multi-level interconnect structure of claim 14, wherein said electrically insulating bottom buffer layer further provides a blocking material with effective diffusion barrier properties against contamination of said semiconductor substrate by the metallization materials and ionic contaminants.

16. The multi-level interconnect structure of claim 14 wherein said electrically insulating bottom buffer layer enables formation of said free-space medium without damage to said underlying transitory and isolation regions.

17. The multi-level interconnect structure of claim 1, wherein said hermetically sealed free-space medium comprises a gaseous material.

18. The multi-level interconnect structure of claim 1, wherein said hermetically sealed free-space medium comprises vacuum.

19. The multi-level interconnect structure of claim 17, wherein said gaseous material is in the pressure range of less than 5 atmospheres.

20. The multi-level interconnect structure of claim 17, wherein said gaseous material is at or near the atmospheric pressure.

21. The multi-level interconnect structure of claim 17, wherein said gaseous material comprises a high-thermal-conductivity inert gas.

22. The multi-level interconnect structure of claim 21, wherein said inert gas comprises helium or argon.

23. The multi-level interconnect structure of claim 17, wherein said gaseous material comprises nitrogen or hydrogen.

24. The multi-level interconnect structure of claim 17, wherein said gaseous material suppresses electrical leakage currents and gas breakdown within said free-space medium due to said electrically conductive interconnect segments and plugs.

25. The multi-level interconnect structure of claim 19 wherein the exposed surfaces of said plurality of electrically conductive interconnect segments and plugs further comprise an encapsulation coating layer.

26. The multi-level interconnect structure of claim 11, wherein said encapsulation coating layer comprises an electrically conductive material (such as $TiN_x$, $TaN_x$, $Wn_x$, or silver).

27. The multi-level interconnect structure of claim 25, wherein said encapsulation coating layer comprises an electrically insulating material (such as silicon dioxide, silicon nitride, aluminum nitride, aluminum oxide, or diamond-like carbon).

28. The multi-level interconnect structure of claim 27, wherein said electrically insulating encapsulation coating layer suppresses electrical leakage and breakdown within said interconnect structure.

29. The multi-level interconnect structure of claim 1 wherein at least a portion of said plurality of electrically conductive interconnect segments and plugs comprises a high electrical conductivity material (such as copper, silver, gold, or a superconducting material).

30. The multi-level interconnect structure of claim 1, wherein a portion of said electrically conductive plugs comprises the conductive contact plugs which provide electrical connection between the first metallization level and underlying semiconductor devices and are encapsulated in a conductive diffusion barrier layer (such as $TiN_x$, $TaN_x$, $Wn_x$, Ta, or a ternary conductive barrier material).

31. The multi-level interconnect structure of claim 30, wherein the plurality of metallization levels between the second level and the top level as well as the plurality of electrically conductive via plugs providing interlevel connections above first metallization level do not utilize any electrically conductive diffusion barrier layers.

32. The multi-level interconnect structure of claim 9, wherein said top passivation overlayer and said bottom electrically insulating buffer layer are formed using at least one etch-resistant electrically insulating material (such as one or a combination of silicon nitride, aluminum nitride, silicon carbide, boron nitride, or diamond-like coating).

33. The multi-level interconnect structure of claim 9, wherein said top passivation overlayer and said bottom electrically insulating buffer layer join together to make a sealed contact at the peripheral region of said semiconductor integrated circuit chip to form a hermetically-sealed and mechanically stable cavity encapsulating said plurality of electrically conducting metallization levels, said plurality of electrically conductive plugs, and said free-space medium.

34. The multi-level interconnect structure of claim 1, wherein at least a substantial portion of contact interfaces among said electrically conductive metallization levels and electrically conductive plugs comprise direct connections of identical metallization materials without any interfacial contact barrier layers.

35. The multi-level interconnect structure of claim 1, wherein a plurality of dummy plugs connected to bottom surface of the top passivation overlayer provides additional structural and mechanical support for said multi-level interconnect structure.

* * * * *